(12) United States Patent
Ueta

(10) Patent No.: US 6,618,120 B2
(45) Date of Patent: Sep. 9, 2003

(54) DEVICES AND METHODS FOR COMPENSATING FOR TILTING OF A LEVELING TABLE IN A MICROLITHOGRAPHY APPARATUS

(75) Inventor: Toshio Ueta, Foster City, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/976,303

(22) Filed: Oct. 11, 2001

(65) Prior Publication Data
US 2003/0071981 A1 Apr. 17, 2003

(51) Int. Cl.[7] .............................................. G03B 27/58
(52) U.S. Cl. ........................................................ 355/72
(58) Field of Search .............................. 355/72, 53, 39

(56) References Cited
U.S. PATENT DOCUMENTS

| | | | |
|---|---|---|---|
| 5,443,932 A | * 8/1995 | Ohta et al. ..................... | 355/53 |
| 5,461,237 A | * 10/1995 | Wakamoto et al. ........ | 250/548 |
| 5,661,388 A | * 8/1997 | Kurosawa .................... | 310/311 |
| 6,122,036 A | * 9/2000 | Yamasaki et al. .............. | 355/53 |

* cited by examiner

Primary Examiner—Russell Adams
Assistant Examiner—D. Ben Esplin
(74) Attorney, Agent, or Firm—Klarquist Sparkman LLP

(57) ABSTRACT

With respect to exposure apparatus, apparatus and methods are disclosed for compensating for lateral shift of a leveling table caused by a tilt (θ) of the leveling table. One embodiment includes a wafer-stage-position loop servo, a leveling-table tilt-position loop servo, and a first feed-forward loop from the leveling-table tilt-position loop servo to the wafer-stage-position loop servo. The first feed-forward loop converts a torque-control signal for the leveling table to a linear-acceleration-control signal for the wafer stage. Thus, the wafer stage moves laterally to compensate for lateral shift of the leveling table. If the exposure apparatus includes a reticle stage controlled by a reticle-stage-position loop servo, then the subject apparatus can include (in addition to or in place of the first feed-forward loop) a second feed-forward loop from the leveling-table tilt-position loop servo to the reticle-stage-position loop servo. The second feed-forward loop converts a positional signal for the leveling table to a position-control signal for the reticle stage, to cause the reticle stage to undergo lateral compensatory motion. The methods and apparatus provide a faster and more accurate compensation for lateral shifts of the leveling table.

30 Claims, 20 Drawing Sheets

DEVICES AND METHODS FOR COMPENSATING FOR TILTING OF A LEVELING TABLE IN A MICROLITHOGRAPHY APPARATUS

FILED OF THE INVENTION

This invention pertains to microlithography, which involves the transfer of a pattern, usually defined by a reticle or mask, onto a "sensitive" substrate using an energy beam. Microlithography is a key technique used in the manufacture of microelectronic devices such as integrated circuits, displays, thin-film magnetic heads, and micromachines. More specifically, the invention pertains to methods and devices, used in the context of a microlithography method and apparatus, respectively, for compensating for lateral shift accompanying a leveling tilt imparted to a leveling table, such as a wafer table, associated with the wafer stage.

BACKGROUND OF THE INVENTION

As the density and miniaturization of microelectronic devices has continued to increase, the accuracy and resolution demands imposed on microlithographic methods and apparatus also have increased. Currently, most microlithography is performed using, as an energy beam, a light beam (typically deep UV light) produced by a high-pressure mercury lamp or excimer laser, for example. Emerging microlithographic technologies include charged-particle-beam ("CPB"; e.g., electron-beam) microlithography and "soft-X-ray" (or "extreme UV") microlithography.

All microlithographic technologies involve pattern transfer to a suitable substrate, which can be, for example, a semiconductor wafer (e.g., silicon wafer), glass plate, or the like. So as to be imprintable with the pattern, the substrate typically is coated with a "resist" that is sensitive to exposure, in an image-forming way, by the energy beam in a manner analogous to a photographic exposure. Hence, a substrate prepared for microlithographic exposure is termed a "sensitive" substrate.

Microlithography conventionally is performed using any of various basic approaches including "direct writing," "contact printing," and "projection" microlithgraphy. Projection microlithography is the most common.

Basic aspects of a modern microlithography apparatus ("exposure apparatus") 10 are shown in FIG. 18, in the context of a projection-exposure apparatus. A pattern is defined on a reticle (sometimes termed a "mask") 12 mounted on a reticle stage 14. The reticle 12 is "illuminated" by an energy beam (e.g., UV light, charged particle beam, X-rays) produced by a source 16 and passed through an illumination-optical system 18. As the energy beam passes through the reticle 12, the beam acquires an ability to form an image, of the illuminated portion of the reticle 12, downstream of the reticle 12. The beam passes through a projection-optical system 20 that focuses the beam on a sensitive surface of a substrate 22 held on a substrate stage ("wafer stage" or "wafer XY stage") 24. As shown in the figure, the source 16, illumination-optical system 18, reticle stage 14, projection-optical system 20, and wafer stage 24 generally are situated relative to each other along an optical axis AX. The reticle stage 14 is movable at least in the X- and $\theta_3$-directions via a stage actuator 26 (e.g., linear motor), and the positions of the reticle stage 14 in the X- and Y-directions are detected by respective interferometers 28. The apparatus 10 is controlled by a controller (computer) 30.

The substrate 22 (also termed a "wafer") is mounted on the wafer stage 24 via a wafer chuck 32 and wafer table 34 (also termed a "leveling table"). The wafer stage 24 not only holds the wafer 22 for exposure (with the resist facing in the upstream direction) but also provides for controlled movements of the wafer 22 in the X- and Y-directions as required for exposure and for alignment purposes. The wafer stage 24 is movable by a suitable wafer-stage actuator 23 (e.g., linear motor), and positions of the wafer stage 24 in the X- and Y-directions are determined by respective interferometers 25. The wafer table 34 is used to perform fine positional adjustments of the wafer chuck 32 (holding the wafer 22), relative to the wafer stage 24, in the X-, Y-, and Z-directions. Positions of the wafer table 34 in the X- and Y-directions are determined by respective wafer-stage interferometers 36.

The wafer chuck 32 is configured to hold the wafer 22 firmly for exposure and to facilitate presentation of a planar sensitive surface of the wafer 22 for exposure. The wafer 22 usually is held to the surface of the wafer chuck 32 by vacuum, although other techniques such as electrostatic attraction can be employed under certain conditions. The wafer chuck 32 also facilitates the conduction of heat away from the wafer 22 that otherwise would accumulate in the wafer during exposure.

Movements of the wafer table 34 in the Z-direction (optical-axis direction) and tilts of the wafer table 34 relative to the Z-axis (optical axis AX) typically are made in order to establish or restore proper focus of the image, formed by the projection-optical system 20, on the sensitive surface of the wafer 22. "Focus" relates to the position of the exposed portion of the wafer 22 relative to the projection-optical system 20. Focus usually is determined automatically, using an auto-focus (AF) device 38. The AF device 38 produces data that is routed to the controller 30. If the focus data produced by the AF device 38 indicates existence of an out-of-focus condition, then the controller 30 produces a "leveling command" that is routed to a wafer-table controller 40 connected to individual wafer-table actuators 40a. Energization of the wafer-table actuators 40a results in movement and/or tilting of the wafer table 34 serving to restore proper focus.

Details of a conventional scheme for tilting of the wafer table 34 are shown in FIG. 19, which shows the wafer stage 24, wafer-stage actuator 23, wafer table 34, and interferometer 36. Relative to the wafer stage 24, the wafer table 34 is supported by the wafer-table actuators 40a. Normally, three wafer-table actuators 40a are provided, supporting the wafer table 34 in a tripod manner, relative to the wafer stage 24, at respective "push points." The wafer-table actuators 40a can be, for example, piezo-electric actuators.

FIG. 19 depicts two closed-loop control systems. A first control system 42 pertains to tilting of the wafer table 34 relative to the wafer stage 24. A second control system 44 pertains to lateral (X-Y) positioning of the wafer stage 34. The first control system 42 is diagrammed as including a comparator 45, a controller 46, and a converter 47. A leveling command from the controller 30 responsive to an AF condition detected by the AF device 38 (FIG. 18) is routed to the comparator 45. The comparator 45 also is connected to a feedback loop 48 discussed below. The output signal of the comparator 45 is routed to the controller 46, which processes the signal according to a respective transfer function $G_{WT}$. The processed signal from the controller 46 is routed to the converter 47, which converts the processed signal to a torque command (voltage) applied to the wafer-table actuators 40a. The resulting energization of the actuators 40a causes the wafer table 34 to tilt relative to the wafer stage 24 and relative to a line $L_{AX}$ parallel to the optical axis AX. The resulting angular rotation of the wafer table 34 is denoted by θ. Data concerning θ is fed back from leveling-table-tilt sensors (not shown) via the feedback loop 48 to the comparator 45.

The second control system 44 includes a comparator 50, a wafer-stage controller 51, and a converter amplifier 52. A stage-position command from the controller 30 is routed to the comparator 50. The comparator 50 is connected to a feedback loop 53 discussed below. The output signal from the comparator 50 is routed to the controller 51, which processes the signal according to a respective transfer function $G_{WS}$. The processed signal from the controller 51 is routed to the converter amplifier 52, which converts the processed signal to a voltage applied to the wafer-stage actuator 23. The applied voltage causes the wafer-stage actuator 23 to move a corresponding distance. The feedback loop 53 routes an output signal from the wafer-table interferometer 36 to the comparator 50.

As shown in FIG. 19, the center of rotation 54 of the wafer table 34 is not at the height of the wafer table 34 but rather is situated a distance L below the wafer table 34. If the wafer table 34 tilts the angle θ in response to the leveling command, the edge of the wafer table 34 effectively experiences a lateral shift of Δx=L sin θ. This lateral shift is detected by the wafer-table interferometer 36, and the corresponding data is fed back to the comparator 50. As a result of this feedback, the wafer-stage actuator 23 can make a compensating movement of the wafer stage 24.

Many lithographic exposures are made in a scanning manner, wherein the reticle stage 14 and wafer stage 24 undergo synchronous motion relative to each other as the pattern is being exposed onto the wafer. Conventional wafer stages are massive (hundred kilograms or more) and consequently have a relatively slow response time to a stage-position command. As a result, a wafer stage 24 provided with a feedback loop 53 as shown in FIG. 19 simply is incapable of making a sufficiently rapid lateral movement to compensate for a change in tilt of the wafer table 34, especially for scanning exposures. As a result, significant inaccuracy is introduced into the exposure.

SUMMARY OF THE INVENTION

In view of the shortcomings of conventional apparatus as summarized above, an object of the invention is to provide apparatus and methods providing improved and more accurate compensations for lateral displacement of the leveling table (wafer table) arising during tilting motions of the leveling table.

As used herein, "compensation" is not limited in meaning to a complete offset of the lateral displacement of the leveling table. Desirably, the amount of compensation is at least effective in reducing the lateral displacement to within alignment specifications. However, any reduction of lateral displacement, compared to not reducing the lateral displacement at all, falls within the scope of "compensation."

"Tilt" and "tilting" of the leveling table is any change in angle (θ) of the plane of the leveling table, relative to a line (Z-direction line parallel to the optical axis), from a previous angle at which the leveling table was positioned.

A "position-loop servo" is a closed-loop feedback-control system governing position of a body such as the wafer stage, leveling table (wafer table), and/or reticle stage. Achieving an actual position (in the X-, Y-, and/or Z-axis direction, or a θ-direction) is performed by a suitable actuator such as a linear motor (wafer stage and reticle stage) or tilting mechanism (leveling table).

To achieve ends as summarized above, a first aspect of the invention is directed, in the context of exposure apparatus and methods, to control systems for compensating for lateral shift of the leveling table caused by a tilt (θ) of the leveling table. The contextual exposure apparatus includes a wafer stage that is movable at least in mutually perpendicular X- and Y-directions and the leveling table that is tiltable relative to a Z-axis (that is perpendicular to the X- and Y-directions). An embodiment of the control system comprises a wafer-stage-position loop servo, a leveling-table tilt-position loop servo, and a feed-forward loop from the leveling-table tilt-position loop servo to the wafer-stage-position loop servo. The wafer-stage-position loop servo is configured to actuate movement of the wafer stage in response to a positional command. The leveling-table tilt-position loop servo is configured to apply a tilting torque to the leveling table in response to a leveling command. The feed-forward loop is configured to convert a torque-control signal for the leveling table to a linear-acceleration-control signal for the wafer stage. The linear-acceleration-control signal causes the wafer stage to move laterally in a manner that compensates for the lateral shift of the leveling table accompanying a change in tilt of the leveling table.

In the embodiment summarized above, the feed-forward loop can be represented by a block diagram that includes a coordinate converter, a controller, and an adder. The coordinate converter is connected to the leveling-table tilt-position loop servo and is configured to convert an angular acceleration (θ", or second derivative of θ) command from the leveling-table tilt-position loop servo to a corresponding linear-acceleration command output from the coordinate converter. The controller is connected downstream of the coordinate converter and is configured to apply a factor $m_s$ to the linear-acceleration command output from the coordinate converter (wherein $m_s$ is a combined mass of the wafer stage and leveling table), thereby producing a first force command. The adder is situated and configured to add the first force command to a second force command produced by the wafer-stage-position loop servo, so as to produce an output routed to a wafer-stage actuator.

The exposure apparatus can further include a reticle stage movable at least in the X- and Y-directions. The reticle stage is controlled by a reticle-stage-position loop servo configured to actuate movement of the reticle stage in response to a reticle-position command. In this configuration, the control system can further comprise a second feed-forward loop from the leveling-table tilt-position loop servo to the reticle-stage-position loop servo. The second feed-forward loop is configured to convert a positional signal for the leveling table to a position-control signal for the reticle stage. The position-control signal causes the reticle stage to move laterally to compensate, at least in part, for the lateral shift of the leveling table accompanying a change in tilt of the leveling table.

In another embodiment, the exposure apparatus includes a reticle stage that is movable at least in the X- and Y-directions, as summarized above. The control system comprises the reticle-stage-position loop servo and leveling-table tilt-position loop servo as summarized above. The control system also includes a first feed-forward loop from the leveling-table tilt-position loop servo to the reticle-stage-position loop servo. The reticle-stage-position loop servo is configured to actuate movement of the reticle stage in response to a reticle-position command. The leveling-table tilt-position loop servo is configured as summarized above. The first feed-forward loop is configured to convert a torque-control signal for the leveling table to a linear-acceleration-control signal for the reticle stage. The linear-acceleration-control signal causes the reticle stage to move laterally to compensate for the lateral shift of the leveling table accompanying a change in tilt of the leveling table. The first feed-forward loop can be represented by a block diagram that includes a controller and an adder. The controller is connected to the leveling-table tilt-position loop servo and is configured to convert a torque command from the leveling-table tilt-position loop servo to a corresponding linear-acceleration or force command output from the controller. The adder is situated and configured to add the command output from the controller to a force command produced by the reticle-stage-position loop servo, so as to produce an output routed to a reticle-stage actuator to cause compensatory motion of the reticle stage.

The control system summarized in the previous paragraph also can include a wafer-stage-position loop servo and a second feed-forward loop. The wafer-stage-position loop servo is configured, as summarized above, to actuate movement of the wafer stage in response to a wafer-position command. The second feed-forward loop extends from the leveling-table tilt-position loop servo to the wafer-stage-position loop servo. The second feed-forward loop is configured to convert a torque-control signal for the leveling table to a linear-acceleration-control signal for the wafer stage. The linear-acceleration-control signal causes the wafer stage to move laterally in a manner that compensates, at least in part, for the lateral shift of the leveling table accompanying a change in tilt of the leveling table. Any remaining compensation can be made by lateral motion of the reticle stage as controlled by the first feed-forward loop.

The control system summarized in the previous paragraph also can include a leveling-table tilt sensor located within a feedback loop of the leveling-table tilt-position loop servo. With such a configuration, the second feed-forward loop can be represented by a block diagram that includes a second controller and a second adder. The second controller is situated and configured to receive a θ output signal from the leveling-table tilt sensor and to convert the θ output signal to a corresponding positional signal routed to the second adder. The second adder is configured to add the θ output signal to a wafer-stage-position command routed to the wafer-stage-position loop servo.

According to another aspect of the invention, exposure apparatus are provided. An embodiment of such an apparatus comprises a projection-optical system, a wafer stage, a leveling table, a wafer-stage-position loop servo, a leveling-table tilt-position loop servo, and a control system. The projection-optical system has an optical axis parallel to the Z-axis. The wafer stage is situated downstream of the projection-optical system and is movable at least in the X- and Y-axis directions. The leveling table is situated downstream of the projection-optical system and is tiltable relative to the Z-axis. The wafer-stage-position loop servo is connected to the wafer stage and is configured to actuate movement of the wafer stage in response to a wafer-position command. The leveling-table tilt-position loop servo is connected to the leveling table and is configured to apply a tilting torque to the leveling table in response to a leveling command. The control system compensates for lateral shift of the leveling table caused by a tilt (θ) of the leveling table. The control system comprises a feed-forward loop from the leveling-table tilt-position loop servo to the wafer-stage-position loop servo. The feed-forward loop is configured to convert a torque-control signal for the leveling table to a linear-acceleration-control signal for the wafer-stage. The linear-acceleration-control signal causes the wafer stage to move laterally in a manner that compensates for the lateral shift of the leveling table accompanying a change in tilt of the leveling table. The feed-forward loop can be represented by a block diagram that includes a coordinate converter, a controller, and an adder, as summarized above.

The exposure apparatus also can include a reticle stage that is situated upstream of the projection-optical system and that is movable at least in the X- and Y-directions. A reticle-stage-position loop servo is connected to the reticle stage and is configured to actuate movement of the reticle stage in response to a reticle-position command. With such a configuration of an exposure apparatus, the control system desirably includes a second feed-forward loop from the leveling-table tilt-position loop servo to the reticle-stage-position loop servo. The second feed-forward loop is configured to convert a positional signal for the leveling table to a position-control signal for the reticle stage. The position-control signal causes the reticle stage to move laterally to compensate, at least in part, for the lateral shift of the leveling table accompanying a change in tilt of the leveling table.

Another embodiment of an exposure apparatus according to the invention comprises a projection-optical system, leveling table, reticle stage, leveling-table tilt-position loop servo, and reticle-stage-position loop servo all as summarized above. The apparatus also includes a control system for compensating for lateral shift of the leveling table caused by a tilt (θ) of the leveling table. The control system includes a first feed-forward loop from the leveling-table tilt-position loop servo to the reticle-stage-position loop servo. The first feed-forward loop is configured to convert a torque-control signal for the leveling table to a linear-acceleration-control signal for the reticle stage. The linear-acceleration-control signal causes the reticle stage to move laterally to compensate for the lateral shift of the leveling table accompanying a change in tilt of the leveling table.

The apparatus summarized in the preceding paragraph can include a reticle-stage actuator that is situated and configured to move the reticle stage in response to the reticle-position command. The reticle-stage actuator is connected to the first feed-forward loop and configured to move the reticle stage in response to the linear-acceleration-control signal to compensate for lateral shift caused by leveling.

The first feed-forward loop can be represented by a block diagram that includes a controller and an adder. The controller is connected to the leveling-table tilt-position loop servo and is configured to convert a torque command from the leveling-table tilt-position loop servo to a corresponding linear-acceleration command or force command output from the controller. The adder is situated and configured to add the command output from the controller to a force command produced by the reticle-stage-position loop servo, so as to produce an output routed to a reticle-stage actuator.

The apparatus can include a wafer stage and wafer-stage-position loop servo, as summarized above. In such a configuration, the control system can further comprise a second feed-forward loop from the leveling-table tilt-position loop servo to the wafer-stage-position loop servo. The second feed-forward loop is configured to convert a torque-control signal to the leveling table to a linear-acceleration-control signal for the wafer stage. The linear-acceleration-control signal causes the wafer stage to move laterally in a manner that compensates, at least in part, for the lateral shift of the leveling table accompanying a change in tilt of the leveling table. Any remaining compensation can be made by lateral motion of the reticle stage as controlled by the first feed-forward loop.

The apparatus can include a leveling-table-tilt sensor located within a feedback loop of the leveling-table tilt-position loop servo. In such a configuration, the second feed-forward loop can be represented by a block diagram that includes a second controller and a second adder. The second controller is situated and configured to receive a θ output signal from the leveling-table tilt sensor and to convert the θ output signal to a corresponding positional signal routed to the second adder. The second adder is configured to add the θ output signal to a wafer-stage-position command routed to the wafer-stage-position loop servo.

Yet another aspect of the invention pertains to methods (in the context of an exposure method in which a substrate, mounted on a wafer stage, is exposed to a pattern defined by a reticle) for maintaining an alignment of the substrate for exposure. In an embodiment of such a method, the substrate is mounted on a leveling table that is tiltable relative to a Z-axis perpendicular to the X- and Y-axis directions. The leveling table is mounted on the wafer stage and is controlled by a leveling-table tilt-position loop servo that applies a tilting torque to the leveling table as required in response to a leveling command corresponding to a torque-control signal. The wafer stage is controlled by a wafer-stage-position loop servo that actuates movement of the wafer stage at least in the X- and Y-axis directions as required in response to a wafer-position command. In association with tilting of the leveling table in response to the tilting command, a torque-control signal is fed forward from the leveling-table tilt-position loop servo to the wafer-stage-position loop servo such that the torque-control signal is converted to an acceleration-control signal for the wafer stage. The acceleration-control signal causes the wafer stage to move laterally to compensate for a lateral shift of the leveling table caused by tilting of the leveling table.

The method can include mounting the reticle in a reticle stage movable at least in the X- and Y-axis directions and controlled by a reticle-stage-position loop servo that actuates movement of the reticle stage in response to a reticle-position command. In such an embodiment, three actions occur in association with tilting of the leveling table in response to the tilting command: (1) feeding forward the torque-control signal from the leveling-table tilt-position loop servo to the reticle-stage-position loop servo; (2) converting the fed-forward torque-control signal to a linear-acceleration-control signal for the reticle stage; and (3) applying the linear-acceleration-control signal to the reticle stage to cause the reticle stage to move laterally to compensate for a lateral shift of the leveling table accompanying a change in tilt of the leveling table.

In another embodiment of a method according to the invention, the substrate is mounted on a leveling table as summarized above. The leveling table is mounted on the wafer stage and is controlled by a leveling-table tilt-position loop servo that applies a tilting torque to the leveling table as required in response to a leveling command corresponding to a torque-control signal. The reticle is mounted on a reticle stage that is movable at least in the X- and Y-axis directions and is controlled by a reticle-stage-position loop servo that actuates movement of the reticle stage in response to a reticle-position command. In association with tilting of the leveling table in response to the tilting command, three actions occur: (1) feeding forward the torque-control signal from the leveling-table tilt-position loop servo toward the reticle-stage-position loop servo; (2) converting the fed-forward torque-control signal to an acceleration-control signal for the reticle stage; and (3) applying the acceleration-control signal to the reticle stage to cause the reticle stage to move laterally to compensate for a lateral shift of the leveling table accompanying a change in tilt of the leveling table.

The method summarized in the preceding paragraph can include the step, while causing the reticle stage to move laterally to compensate for the lateral shift of the leveling table, of inhibiting compensating motions of the wafer stage.

According to another aspect of the invention, positioning apparatus are provided for positioning a substrate. An embodiment of such an apparatus includes a first stage movable at least in a first direction and a second stage mounted on the first stage. The second stage is configured to retain a substrate and is tiltable relative to the first stage. The apparatus includes a control system connected to the first stage and the second stage. The control system includes a first-stage-position loop for the first stage, a second-stage-position loop for the second stage, and a feed-forward loop connected to the first-stage-position loop and the second-stage-position loop. The first-stage-position loop actuates movement of the first stage by utilizing a first-stage control signal. The second-stage-position loop actuates a tilting motion of the second stage by utilizing a second-stage control signal. The feed-forward loop converts the second-stage control signal to the first-stage control signal. The first-stage control signal causes the first stage to move in a manner that compensates for the lateral shift of the substrate accompanying a change in tilt of the second stage.

Another embodiment of a positioning apparatus includes a first stage and second stage as summarized above. The apparatus also includes a third stage that is movable at least in the first direction and configured for motion in a synchronous manner with the substrate moved by the first stage. A control system is connected to the first, second, and third stages. The control system includes a second-stage-position loop for the second stage and a third-stage-position loop for the third stage. A first feed-forward loop is connected to the second-stage-position loop and the third-stage-position loop. The second-stage-position loop actuates a tilting motion of the second stage by utilizing a second-stage control signal. The third-stage-position loop actuates movement of the third stage by utilizing a third-stage control signal. The first feed-forward loop converts the second-stage control signal to the third-stage control signal, and the third-stage control signal causes the third stage to move in a manner that compensates for alignment errors between the third stage and the substrate accompanying a change in tilt of the second stage.

In the embodiment summarized above, the control system can further include a first-stage-position loop for the first stage and a second feed-forward loop connected to the second-stage-position loop and the first-stage-position loop. The first-stage-position loop actuates movement of the first stage by utilizing a first-stage control signal, and the second feed-forward loop converts the second-stage control signal to the first-stage control signal. The first-stage control signal causes the first stage to move in a manner that compensates, at least in part, for alignment errors between the third stage and the substrate accompanying a change in tilt of the second stage. Remaining compensation is contributed by the third stage as controlled by the first feed-forward loop.

The foregoing and additional features and advantages of the invention will be more readily apparent from the following detailed description, which proceeds with reference to the accompanying drawings.

DETAILED DESCRIPTION

This invention is described below in the context of representative embodiments that are not intended to be limiting in any way.

First Representative Embodiment

Figure 1:
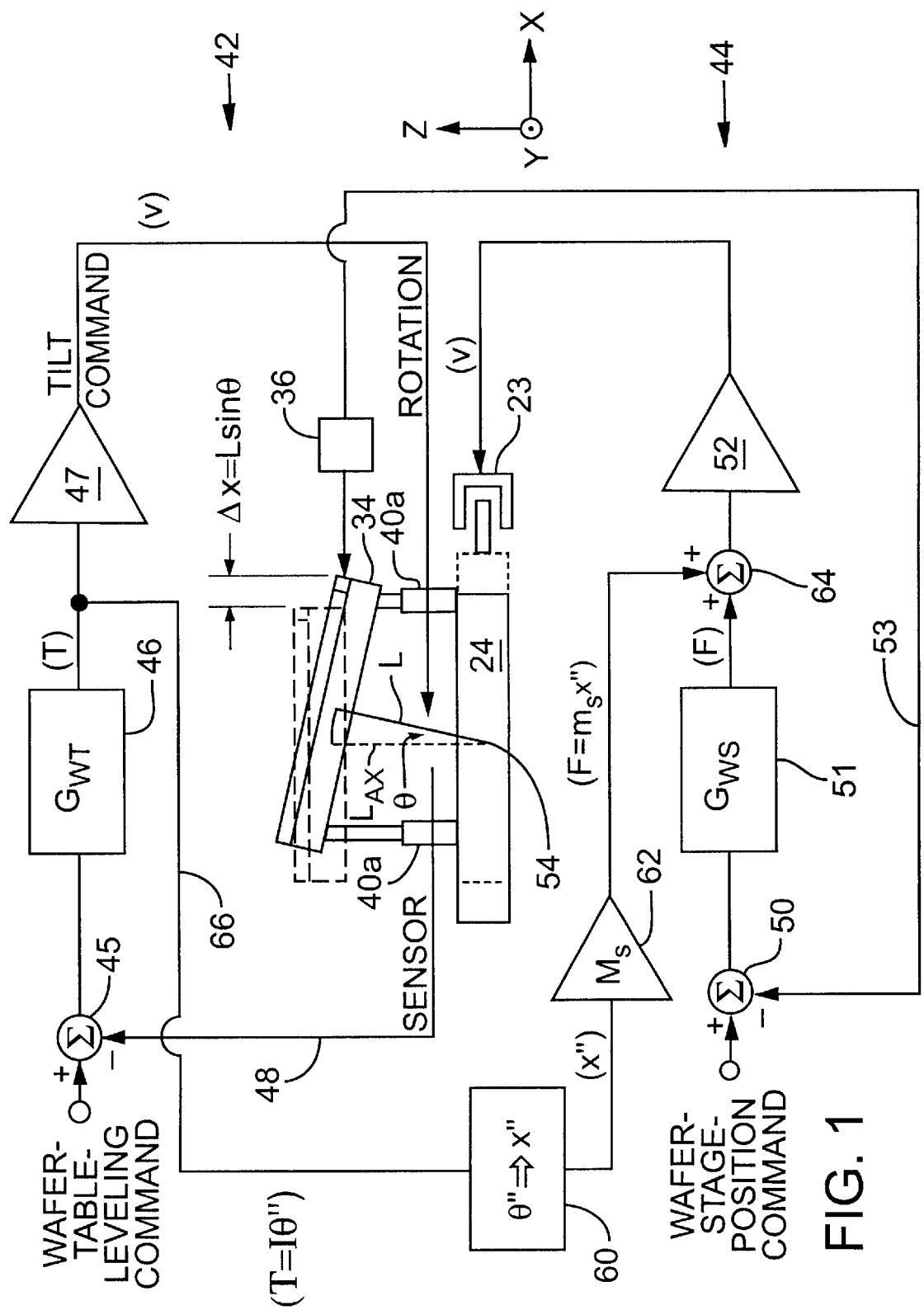
FIG. 1 is a schematic block diagram showing a wafer stage and tiltable wafer table, with associated control systems including a feed-forward torque-control signal to the wafer stage to cause the wafer table to undergo a lateral motion serving to compensate for lateral shift accompanying a tilt of the wafer stage, as described in the first representative embodiment.
Figure 19:
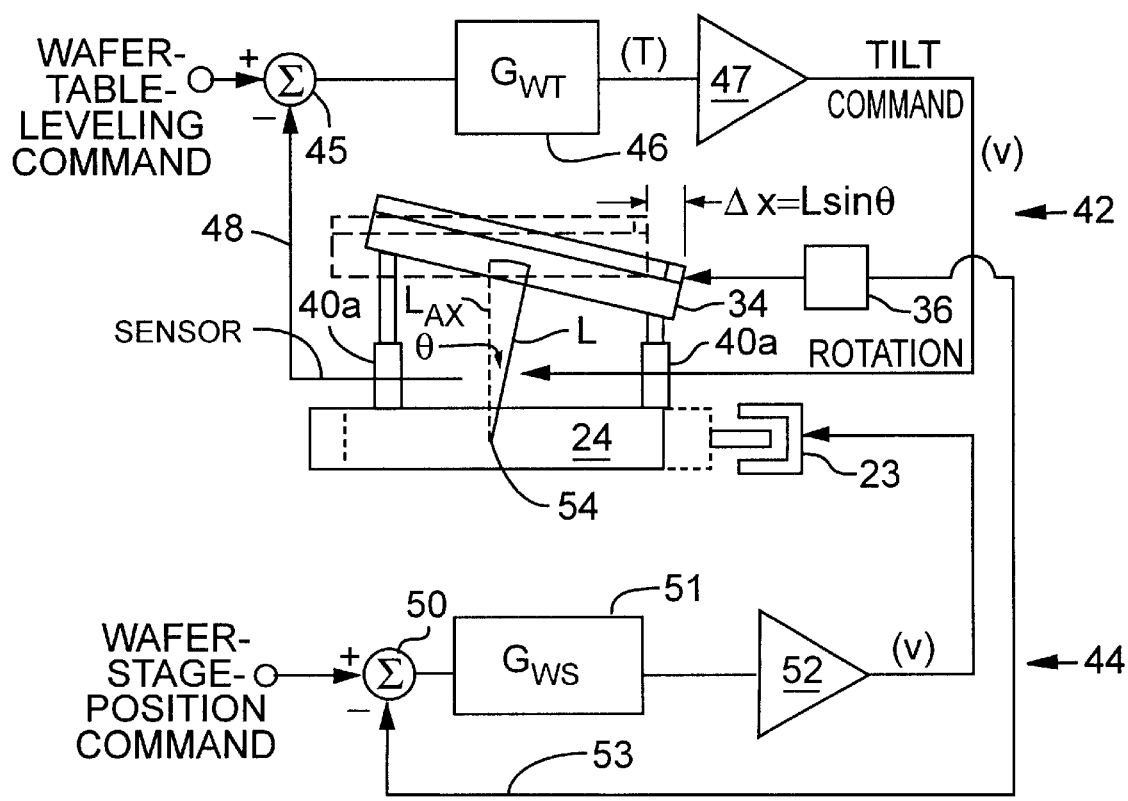
FIG. 19 is a schematic block diagram of a conventional scheme for tilting the wafer table shown in FIG. 18 and for using the wafer stage for making lateral motions to compensate for lateral displacement of the wafer table caused by tilting.

This embodiment is depicted in FIG. 1, in which components that are similar to corresponding components shown in FIG. 19 have the same respective reference numerals. The controller 46 produces an output that is a torque (T) command, wherein $T=I\theta''$, I is inertia, $\theta$ is the tilt angle (in radians) as discussed above, and $\theta''$ is the second derivative of $\theta$ (i.e., the angular acceleration of the wafer table 34 about the center of rotation 54). As described above, this torque command is routed to the converter 47. This torque command also is routed to a coordinate converter 60 that converts units of $\theta''$ into $x''$ or $y''$ units (i.e., acceleration in the X-dimension or Y-dimension, respectively). In this regard, as shown in FIG. 1, the linear displacement of the wafer table 34 is $\Delta x = L \sin \theta$. Because any amount of tilt $\theta$ imparted to the wafer table 34 is extremely small, for practical purposes, $x=L\theta$. Hence, $dx/dt=L(d\theta/dt)$ (i.e., $x'=L\theta'$) and $x''=L\theta''$. From $T=I\theta''$, $\theta''=T/I$; hence $x''=L(T/I)$. Thus, the torque (control) signal, upon passing through the coordinate converter 60, is converted to a $x''$ signal that is routed to a controller 62 (multiplies input by $m_s$, wherein $m_s$ is the mass of the wafer stage plus wafer table). The converter 62 thus produces a force signal F (wherein $F=m_s x''$) fed-forward to an adder (summing junction) 64 situated between the wafer-stage controller 51 and the converter 52.

The acceleration feed-forward line 66 provides a more rapid response (compared to a conventional system) to the wafer stage 24 in compensating for lateral displacement ($\Delta x$ and/or $\Delta y$) caused by tilting of the wafer table 34.

Second Representative Embodiment

This embodiment is directed to establishing a usable relationship between the angular acceleration of a wafer table 34 and acceleration (in the X-Y plane) of a wafer stage 24.

The wafer-table command reference is $\theta_{ref}=A \sin \omega t$, wherein A is the tilt amplitude of the wafer table 34 and $\omega$ is the angular frequency achievable with the wafer table 34.

Figure 2:
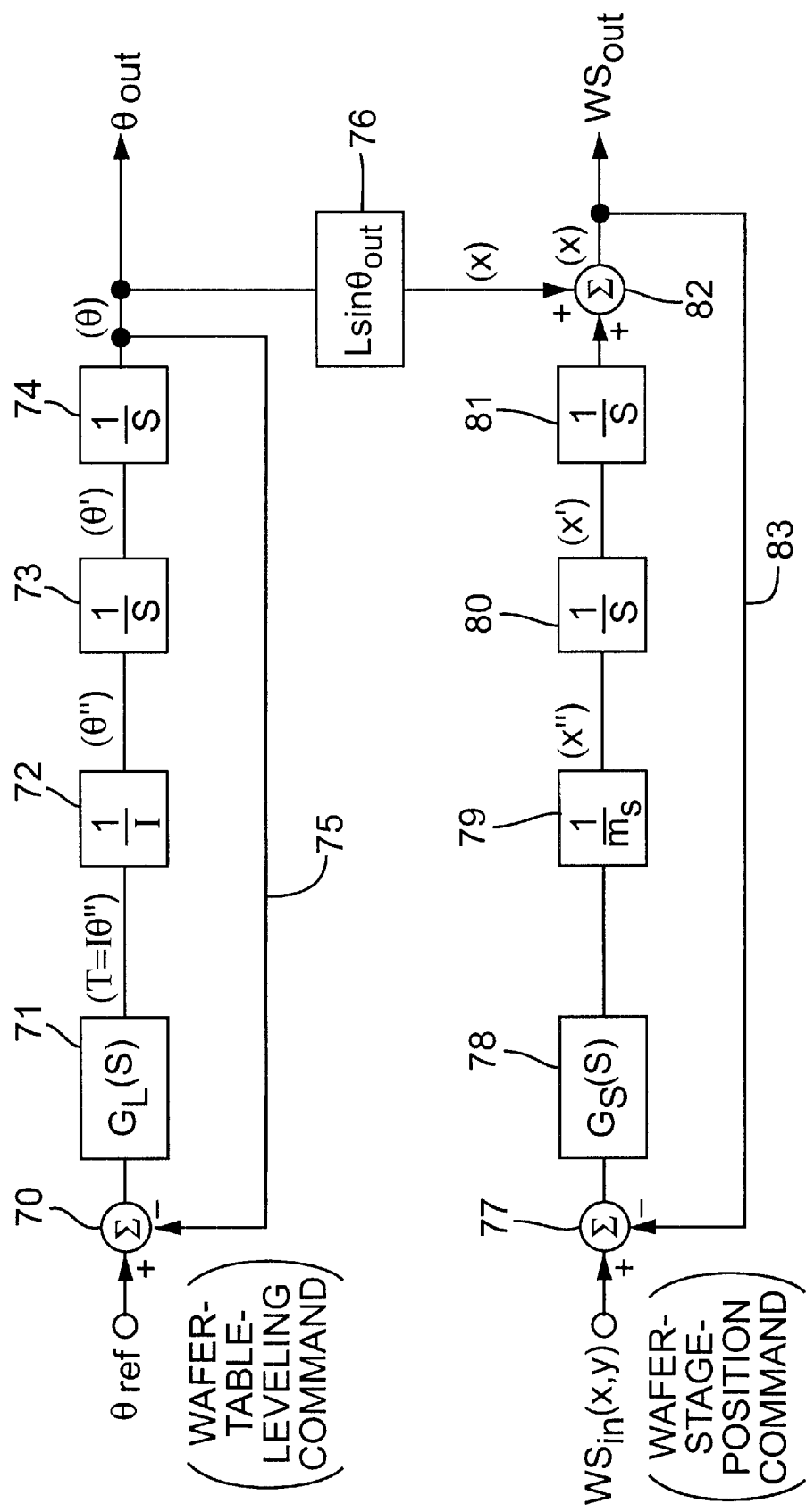
FIG. 2 is a block diagram of a conventional control system used to derive the control system as described in the second representative embodiment.

Beginning with a block diagram as depicted in FIG. 2 (showing a conventional control system), the angular acceleration $\theta''$ is used to reduce the output positional deviation of the wafer stage 24. In FIG. 2, $\theta_{ref}$ is input to a comparator 70. The output of the comparator 70 is connected to a controller 71 that produces, according to a respective transfer function $G_L(s)$, a torque output ($T=I\theta''$). The controller output is converted to a $\theta''$ signal by a converter 72. The $\theta''$ signal is converted by a first integrator 73 to a $\theta'$ signal, and then by a second integrator 74 to a $\theta$ signal ($\theta_{out}$). The $\theta_{out}$ signal is fed back 75 to the comparator 70. The error component of $L \sin \theta_{out}$ (e.g., x and/or y) caused by rotation ($\theta_{out}$) of the wafer table 34 is added at an adder 82 via a converter 76. A wafer-stage-position command $WS_{in}$ is input to a comparator 77. The output of the comparator 77 is processed by a controller 78 according to a respective transfer function $G_S(s)$. Using the positional signal x as an example, the output from the controller 78 is converted to an $x''$ signal by a converter 79, and by a first integrator 80 to an $x'$ signal, and then by a second integrator 81 to an x signal. The x signal is routed to an adder (summing junction) 82 that also receives the output fed-forward from the controller 76. The output from the adder 82 is the wafer-stage output signal ($WS_{out}$), which is fed back 83 to the comparator 77.

In this example, $\theta''$ (angular acceleration) is used to reduce deviation in the wafer-stage output ($WS_{out}$). In this regard, reference is made to the block diagram of FIG. 3, in which components that are similar to those shown in FIG. 2 have the same respective reference numbers. A control system according to the block diagram of FIG. 3 (corresponding to the embodiment shown in FIG. 1) provides a changing axis of rotation of the wafer table (i.e., the center of rotation of the wafer table shifts from an initial position toward the wafer on the wafer table). The torque output (T=Iθ") is converted to a θ" signal by a converter 272. The output of the converter 272 is routed to a converter 84. The θ" signal is fed-forward through two converters 84, 85 (multiply input by L and $m_s$, respectively, wherein $m_s$ is the mass of the wafer stage plus wafer table) to an adder (summing junction) 86 that also receives, as an input, the output from the controller 78.

The factor (L) by which the converter 84 multiplies its input is determined as follows. For one degree of freedom of motion (e.g., X-direction motion) of the wafer stage, and according to a Jacobian approach, $\partial x/\partial \theta$=L sin θ=L cos θ. Hence, x'=(L cos θ)(θ'). Since $\partial x'/\partial \theta'$=L cos θ, x"=(L cos θ)(θ"). If θ is small, then sin θ≈0 and cos θ≈1. Hence, x"=Lθ" (i.e., acceleration of the wafer stage is L times the angular acceleration of the wafer table). Therefore, it is determined that the converter 84 applies the gain L. The converter 85 multiplies the output of the converter 84 by $m_s$.

The foregoing analysis is based on one degree of freedom of motion of the wafer stage. For two degrees of freedom, a more complicated Jacobian matrix is required.

EXAMPLE 1 AND COMPARISON EXAMPLE 1

In this example, positional deviation of a wafer stage is reduced using target $\theta_x$ and $\theta_y$ torques of the wafer table as the feed-forward signal for the wafer stage. This example is directed to the results of considering two degrees of freedom of motion of the wafer stage. The target $\theta_x$ and $\theta_y$ torques are converted to respective target angular accelerations. The target angular accelerations are based on the inertial principal axis of the wafer table. Motion of the wafer stage, in contrast, is based on a mechanical axis. Consequently, the respective angular accelerations are converted (by processing according to a Jacobian transformation matrix) to respective angular accelerations based on mechanical acceleration. This transformation matrix utilizes a Jacobian for two degrees of freedom.

Figure 4:
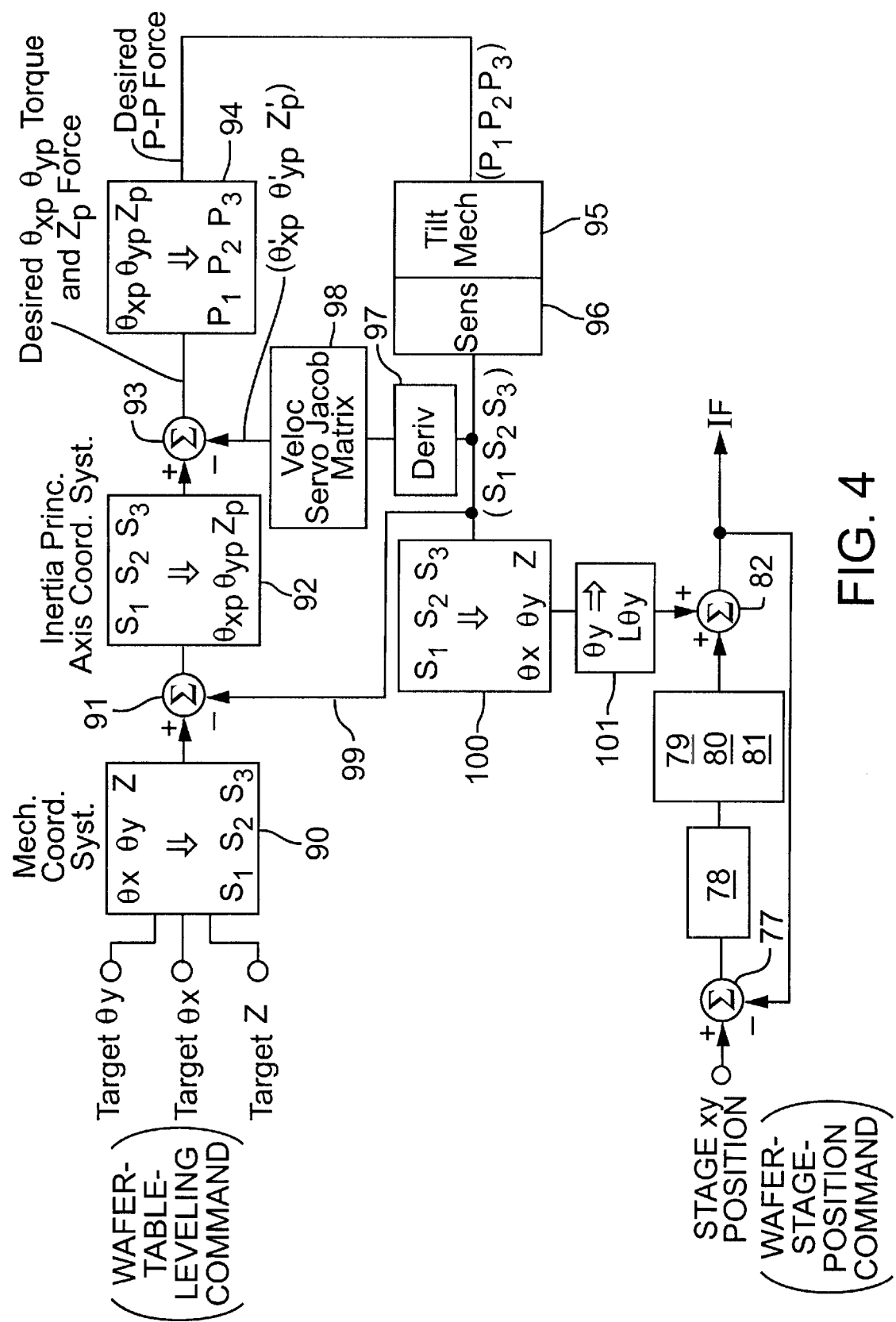
FIG. 4 is a block diagram of the control system of Comparison Example 1.

The comparison example provides data obtained using a conventional wafer-table mechanism as shown generally in FIG. 19, which is shown as a more detailed block diagram in FIG. 4. The block diagram of FIG. 4 is for a wafer table having three degrees of freedom ($\theta_x$, $\theta_y$ and Z). Briefly, in FIG. 4, target values of $\theta_x$, $\theta_y$, and Z (based on a mechanical coordinate system) are processed by a first transfer matrix 90 that converts these values to respective sensor values $S_1$, $S_2$, $S_3$. The sensor values, as processed by a comparator 91, are routed to a second transfer matrix 92 (corresponding to the controller 71 in FIG. 2) that converts the S1, S2, S3 values to respective coordinates $\theta_{xp}$, $\theta_{yp}$, $Z_p$ on the inertial principal axis coordinate system. The inertia coordinates (representing desired torque coordinates $\theta_{xp}$, $\theta_{yp}$ and desired $Z_p$ force) are processed by a comparator 93 and routed to a third transfer matrix 94. The transfer matrix 94 converts these desired torque coordinates and force to corresponding "push-point" forces $P_1$, $P_2$, $P_3$ applied by respective wafer-table actuators to the wafer table. These push-point forces $P_1$, $P_2$, $P_3$ are routed to the wafer-table tilt mechanism 95 (corresponding to the converter 72, first integrator 73, and second integrator 74 in FIG. 2). The resulting tilt position of the wafer table is sensed by sensors 96 that produce corresponding positional data $S_1$, $S_2$, $S_3$.

The sensor data $S_1$, $S_2$, $S_3$ are distributed as follows. First, these data are differentiated by a differential block 97, thereby producing corresponding sensor "velocity" data. The sensor velocity data are processed by a velocity servo Jacobian matrix 98 for feedback as respective $\theta_{xp}'$, $\theta_{yp}'$, $Z_p'$ data to the comparator 93. The sensor data $S_1$, $S_2$, $S_3$ also are fed back 99 to the comparator 91. The error component caused by tilting of the wafer table 34 is added at the adder 82 via a fourth transfer matrix 100 and a transfer function 101. The sensor data $S_1$, $S_2$, $S_3$ are converted to respective $\theta_x$, $\theta_y$, Z data by the fourth transfer matrix 100 and added at the adder 82 as lateral displacement information by the transfer function 101 (e.g., converting $\theta_y$ to L sin $\theta_y$). The adder 82, as discussed above in connection with FIG. 2, also receives the output from the controller 78 via the converter 79, the first integrator 80, and the second integrator 81. The output from the adder 82 provides one degree of freedom for the wafer stage, and represents the respective wafer-stage interferometer (IF) data.

Figure 5:
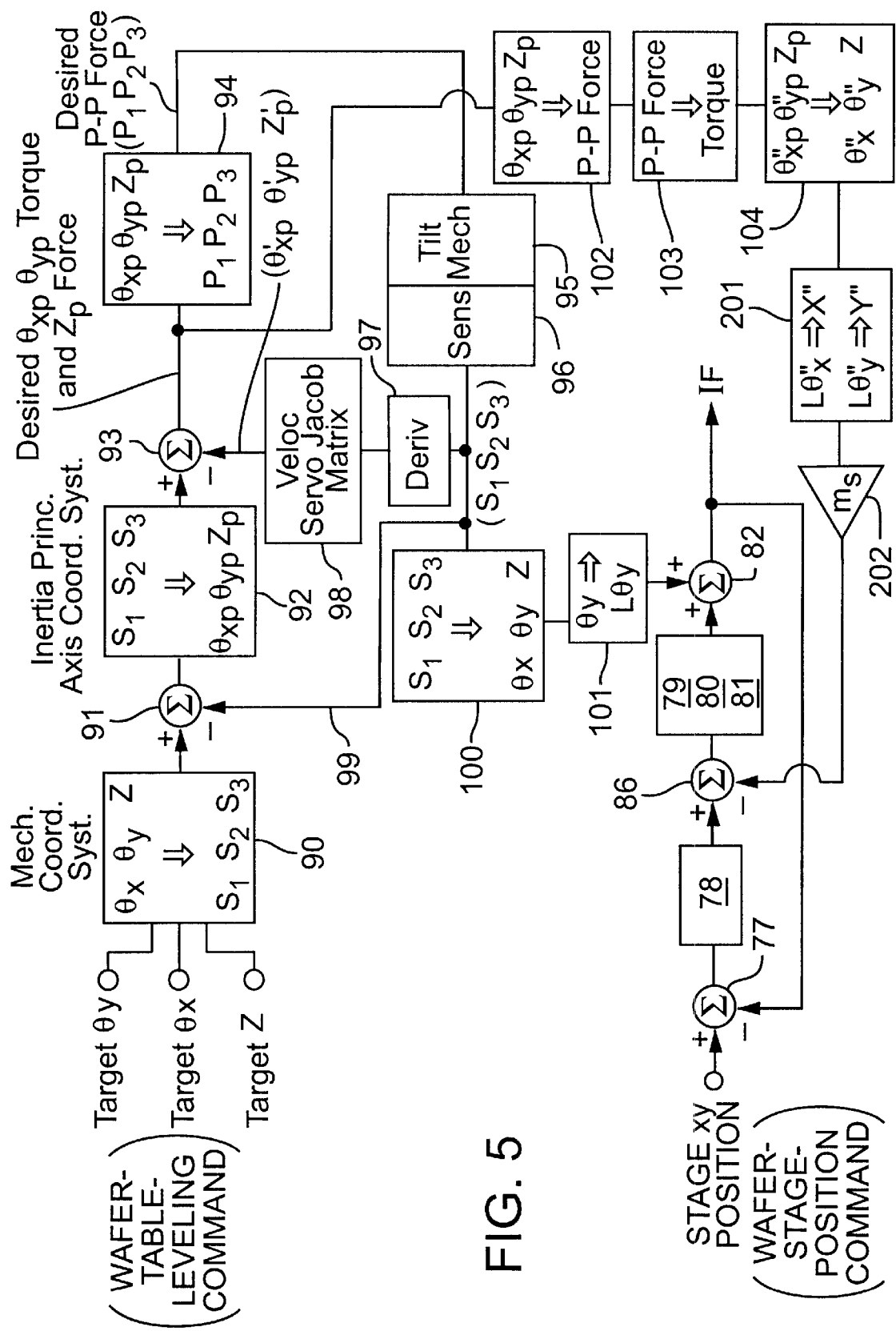
FIG. 5 is a block diagram of the control system of Example 1.

FIG. 5 is a block diagram of the example. In FIG. 5, components that are the same as shown in FIG. 4 have the same respective reference numerals and are not described further. In contrast to the scheme depicted in FIG. 4, this example includes a feed-forward loop as described above. The feed-forward loop begins with data output from the comparator 93 that are routed to and processed by a fifth transfer matrix 102 that converts the data $\theta_{xp}$, 74 $_{yp}$, $Z_p$ (based on the inertial principal axis coordinate system) to respective push-point forces. Data regarding the push-point forces are processed by a sixth transfer matrix 103 to respective torque data $\theta_{xp}"$, $\theta_{yp}"$, $Z_p$. A seventh transfer matrix 104 converts the torque data $\theta_{xp}"$, $\theta_{yp}"$, $Z_p$ to respective second-derivative data $\theta_x"$, $\theta_y"$, Z based on the mechanical coordinate system. These data $\theta_x"$, $\theta_y"$, Z are converted (e.g., L$\theta_x"$ to X" and L$\theta_y"$ to Y") by a coordinate controller 201 (corresponding to the converter 84 shown in FIG. 3), multiplied by the mass $m_s$ of the wafer stage and wafer table by a converter 202 (corresponding to the converter 85 shown in FIG. 3), and routed to the comparator 86, as described above in connection with FIG. 3.

Figure 6:
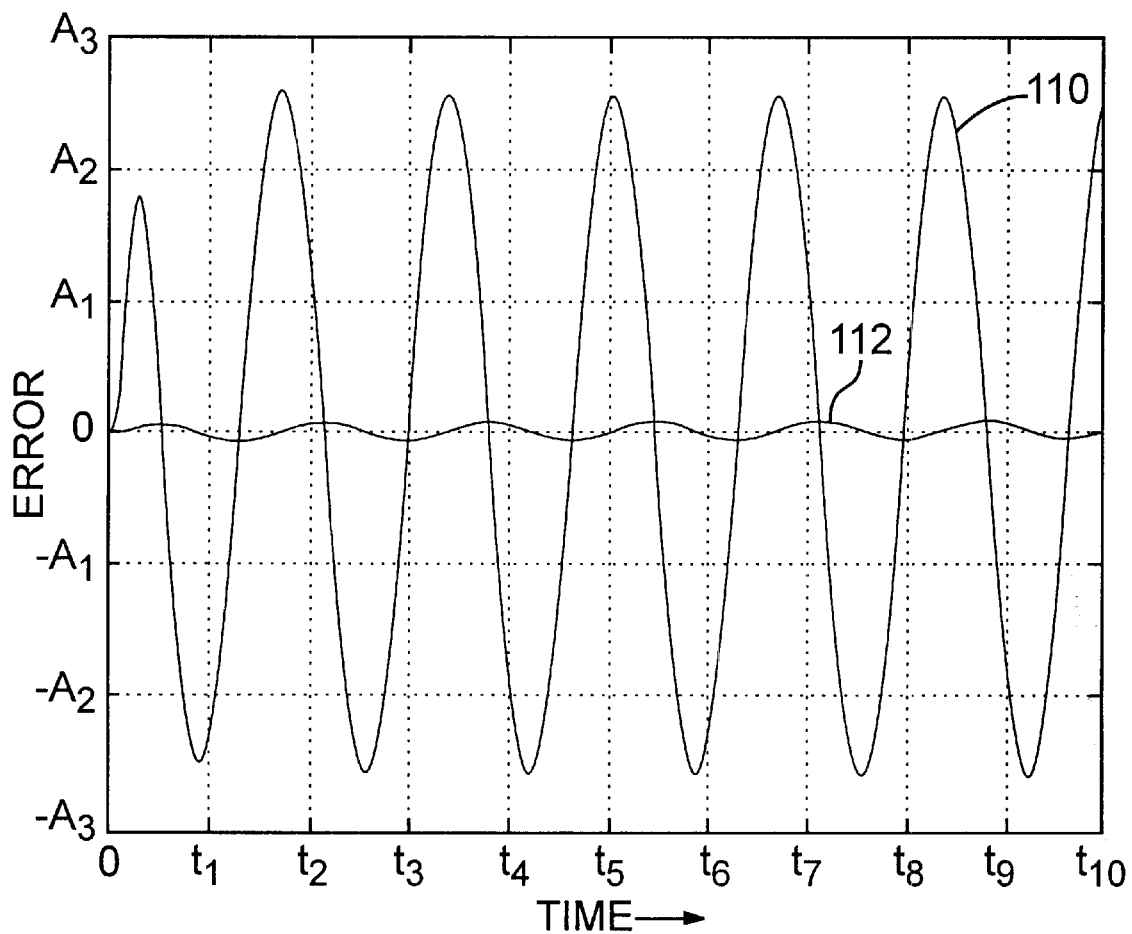
FIG. 6 is a plot of uncorrected wafer-stage error (obtained in Comparison Example 1) and corrected wafer-stage error (obtained in Example 1).

Exemplary results are shown in FIG. 6. The curve 110 is of uncorrected wafer-stage error (X-direction) obtained using the comparison example, and the curve 112 is of corrected wafer-stage error (X-direction) obtained using the example. Hence, by providing the wafer stage with a torque feed-forward compensation, the leveling-shift deviation of the wafer stage is reduced compared to a conventional wafer stage having no such compensation.

Third Representative Embodiment

In this embodiment, alignment errors occurring at the wafer stage due to tilting of the wafer table are eliminated by compensatory motions of a reticle stage, either alone or in combination with compensatory motions of the wafer stage. With respect to compensatory motions by the reticle stage, a "reticle fine stage" can be used. In this regard, reference is made back to FIG. 18, which depicts a microlithography apparatus including a reticle stage 14. In many microlithography apparatus, the reticle 12 actually is mounted on a "reticle fine stage" 13 that is mounted to the reticle stage 14. Whereas, in such a configuration, the reticle stage 14 is used to make relatively "coarse" changes in reticle position (e.g., in the X, Y, and $\theta_z$ directions), the reticle fine stage 13 can be used to make relatively fine adjustments in the X, Y, and $\theta_z$ directions. The reticle fine stage 13 moves the reticle 12 relative to the reticle stage 14. The mass of the reticle fine stage 13 moved in either of the X- and Y-directions is the same.

This embodiment is especially useful for microlithography apparatus that perform exposures by scanning (e.g., step-and-scan). Such apparatus generally require higher performance (e.g., faster response time) in compensating for tilt of the wafer table than step-and-repeat apparatus.

An advantage of utilizing the reticle fine stage for making compensatory motions is that, compared to a wafer stage or even a wafer table, the reticle fine stage is comparatively light in mass. A wafer stage, in contrast, is quite massive. (E.g., a wafer stage capable of accommodating a 300-mm diameter wafer typically has a mass of at least 100 kg. However, this embodiment and other embodiments according to the invention can be used with a reticle coarse stage or other type of reticle stage that consists of one stage not divided into "coarse" and "fine" stages.) Providing a control-position feedback loop and a power amplifier exhibiting a sufficiently high-frequency response for such a massive object is extremely difficult. Its lighter mass allows the reticle fine stage to exhibit a higher frequency response, when making compensatory motions to offset alignment errors due to tilting of the wafer table, than the wafer stage. Also, in contrast to a typical wafer stage, the mass of the reticle fine stage movable in the X-direction is equal to the mass of the reticle fine stage movable in the Y-direction. Consequently, the reticle fine stage exhibits substantially the same response frequency in both the X-direction and the Y-direction. With a wafer stage, in contrast, the mass movable in one of the X- and Y-directions normally is substantially greater (usually in the X-direction, due to a greater stacked mass borne by the X-direction movement mechanism) than in the other direction. Consequently, the response frequency is lower in the more massive direction than in the less massive direction.

Motions of the wafer stage (to compensate for tilting of the wafer table) can result in position-alignment errors between the reticle and the substrate. According to this embodiment, if compensatory motions are made by both the wafer stage and the reticle stage, then the reticle stage undergoes a motion to compensate for position-alignment errors between the reticle and substrate arising from a lateral positional shift of the wafer stage.

In making compensatory motions of the reticle stage, it is desirable under some conditions that such motions be made separately of any motions by the wafer stage. During motion of the wafer stage, if the reticle stage is actuated to compensate for the change in position of the wafer stage, stability is difficult to obtain. This is because, when the reticle stage moves to reestablish alignment of the reticle with the wafer, the wafer stage already has moved to another position due to the action of its positional feedback loop. The reticle stage receives, by a feed-forward line, data concerning the lateral shift of the wafer table; however, this does not provide the reticle stage with information on how far the wafer stage can move to compensate for the lateral shift.

Figure 7:
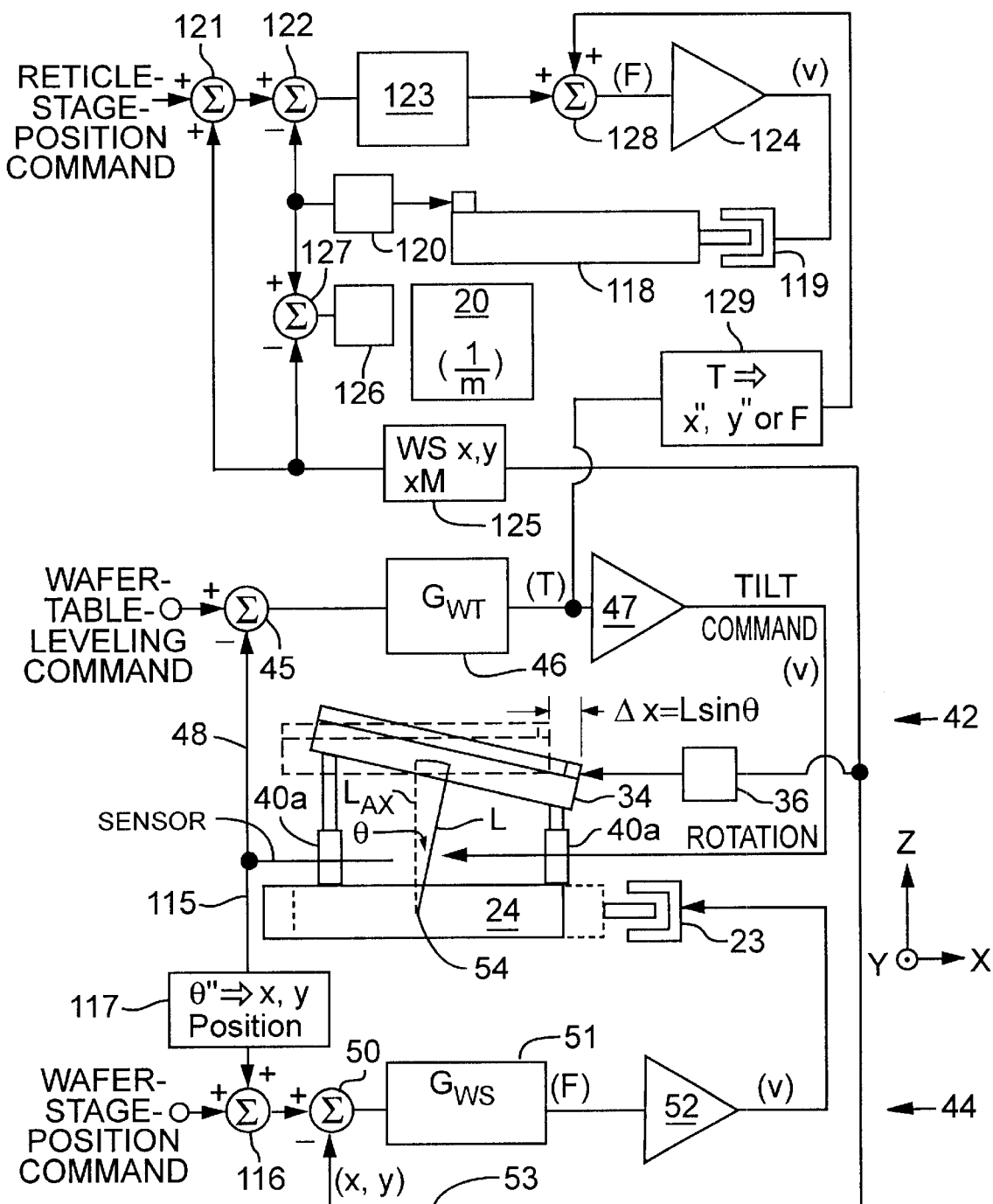
FIG. 7 is a schematic diagram showing a wafer stage, a tiltable wafer table, and a reticle stage, with associated control systems including a feed-forward torque-control signal to the reticle stage to cause the reticle stage to undergo a lateral motion serving to compensate for lateral shift accompanying a tilt of the wafer table, as described in the second representative embodiment.

A block diagram of a control scheme for utilizing the reticle stage for compensating for tilting motion of the wafer table is shown generally in FIG. 7, in which components that are similar to corresponding components shown in FIG. 1 have the same respective reference numerals. First, similar to the scheme shown in FIG. 1, sensor data regarding tilt of the wafer table 34 are fed back 48 to the comparator 45. In addition, this data is fed forward 115 to an adder (summing junction) 116 via a conversion matrix 117 that converts angle data to corresponding positional data useful as a target position for the wafer stage.

The apparatus of FIG. 7 includes a reticle stage 118 actuated by a linear actuator 119. The position of the reticle stage 118 is detected by at least one interferometer 120. A reticle-stage-position command passes through an adder (summing junction) 121 and a comparator 122 to a controller 123 that converts the reticle-stage-position command to corresponding force (V) signals routed to the linear actuator 119 via a converter 124. For achieving alignment of the reticle stage 118 with the wafer stage 24, data from the interferometer 36 is routed to an adder 122 via a converter 125 applies a factor M to the wafer-stage x-y data, wherein 1/M is the demagnification ratio of the projection-optical system 20. Alignment errors 126 of the reticle stage 118 relative to the wafer table are determined by a comparator 127 that receives an input from the interferometer 120 and an input from the converter 125. Input from the reticle interferometer 120 also is fed-back to the comparator 122. Finally, according to this embodiment, data (regarding torque) from the controller 46 are fed-forward to an adder (summing junction) 128 via a controller 129 that converts torque data to corresponding x", y" or force data.

According to the scheme shown in FIG. 7, the reticle-stage servo is configured to receive data regarding wafer-table lateral position, so as to compensate for lateral-shift errors caused by tilting of the wafer table 34. Lateral-shift compensation that otherwise would be performed by the wafer-stage servo is eliminated via the loop 115 including the conversion matrix 117. Of course, the wafer stage is still free to move to change the exposure-target position on the wafer or to correct errors not caused by tilting of the wafer table 34.

EXAMPLE 2 AND COMPARISON EXAMPLE 2

The comparison example for this example is the same as discussed above in connection with FIGS. 5 and 6. FIG. 5 is the block diagram of the control system used to produce the curve 112 in FIG. 6. The plot 110, of uncorrected wafer-stage error, was produced by the control system shown in FIG. 4.

Figure 8:
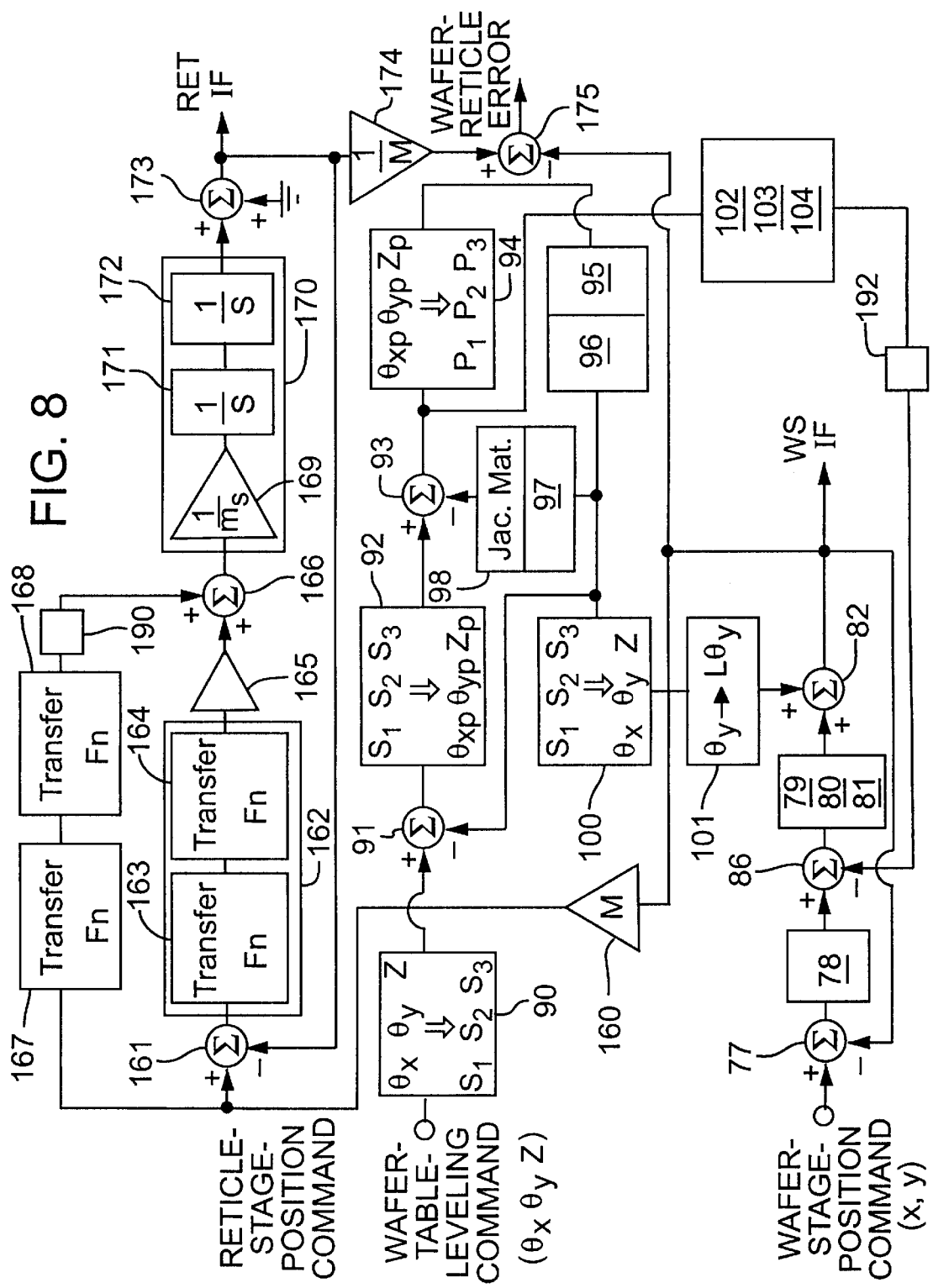
FIG. 8 is a block diagram of the control system of Example 2.

A block diagram of the control system of Example 2 is shown in FIG. 8, in which components that are similar to corresponding components shown in FIG. 5 have the same reference numerals and are not discussed further. The block diagram of FIG. 8 includes use of the reticle stage to reduce the "following error" of the wafer stage. In other words, the reticle stage follows the wafer stage as the reference target of the reticle stage. Beginning at the adder 82, the output of the adder 82 is routed via a converter 160 (which applies a factor M to its input, wherein 1/M is the demagnification ratio of the projection lens) to a comparator 161. The output of the comparator 161 passes through a controller 162 configured to process incoming data according to one or more transfer functions 163, 164. The output of the controller 162 passes through a converter 165, as required, to an adder (summing junction) 166. The adder 166 also receives data, fed-forward from the converter 160, as processed by at least one transfer function 167, 168. The output of the adder 166 is routed to a reticle-stage physical system 170 that includes a converter 169 and two integrators 171, 172. The output from the reticle-stage physical system 170 enters an adder (summing junction) 173 having a grounded input. In any event, the output of the adder 173 includes data from the reticle interferometer. The output data is routed via a converter 174 (that applies a factor 1/M to its input) to a comparator 175. The output from the comparator 175 includes data concerning positional errors between the reticle and the wafer. To such end, the comparator 175 receives, at its other input, data output from the adder 82. Items 190 and 192 are respective on-off switches.

Figure 9:
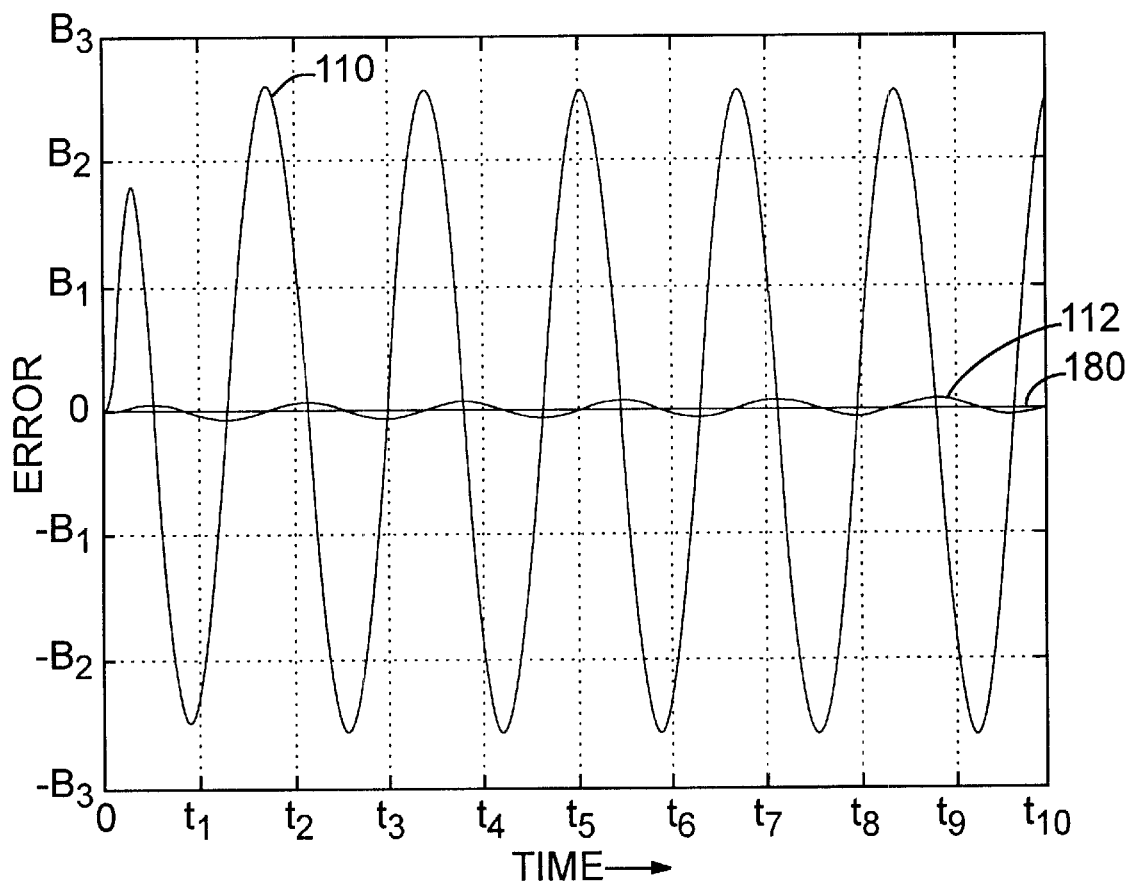
FIG. 9 is a plot of uncorrected wafer-stage error (obtained in Comparison Example 2) and corrected wafer-stage error (obtained in Example 2).

Results obtained from the block diagram of FIG. 8 are shown in FIG. 9, along with the plots 110 and 112 of data as described above in connection with FIG. 6. The straight-line plot 180 is of the "following" error of the reticle stage. Hence, it can be seen that the reticle-stage following function substantially reduces wafer-table error. (The plots 110 and 112 are the same as shown in FIG. 6 and discussed above.)

EXAMPLE 3 AND COMPARISON EXAMPLE 3

Figure 10:
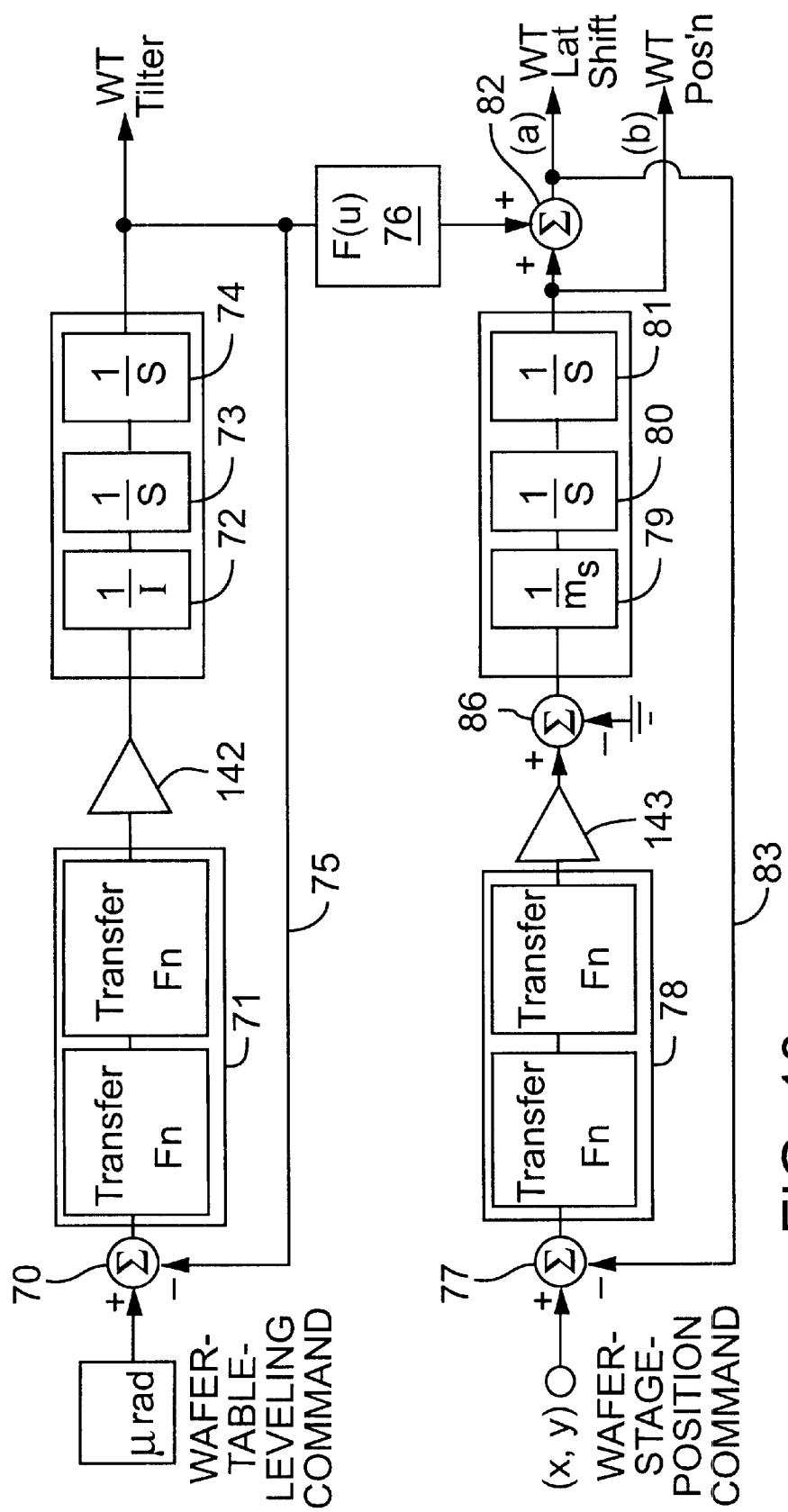
FIG. 10 is a block diagram of the control system of Comparison Example 3.
Figure 11:
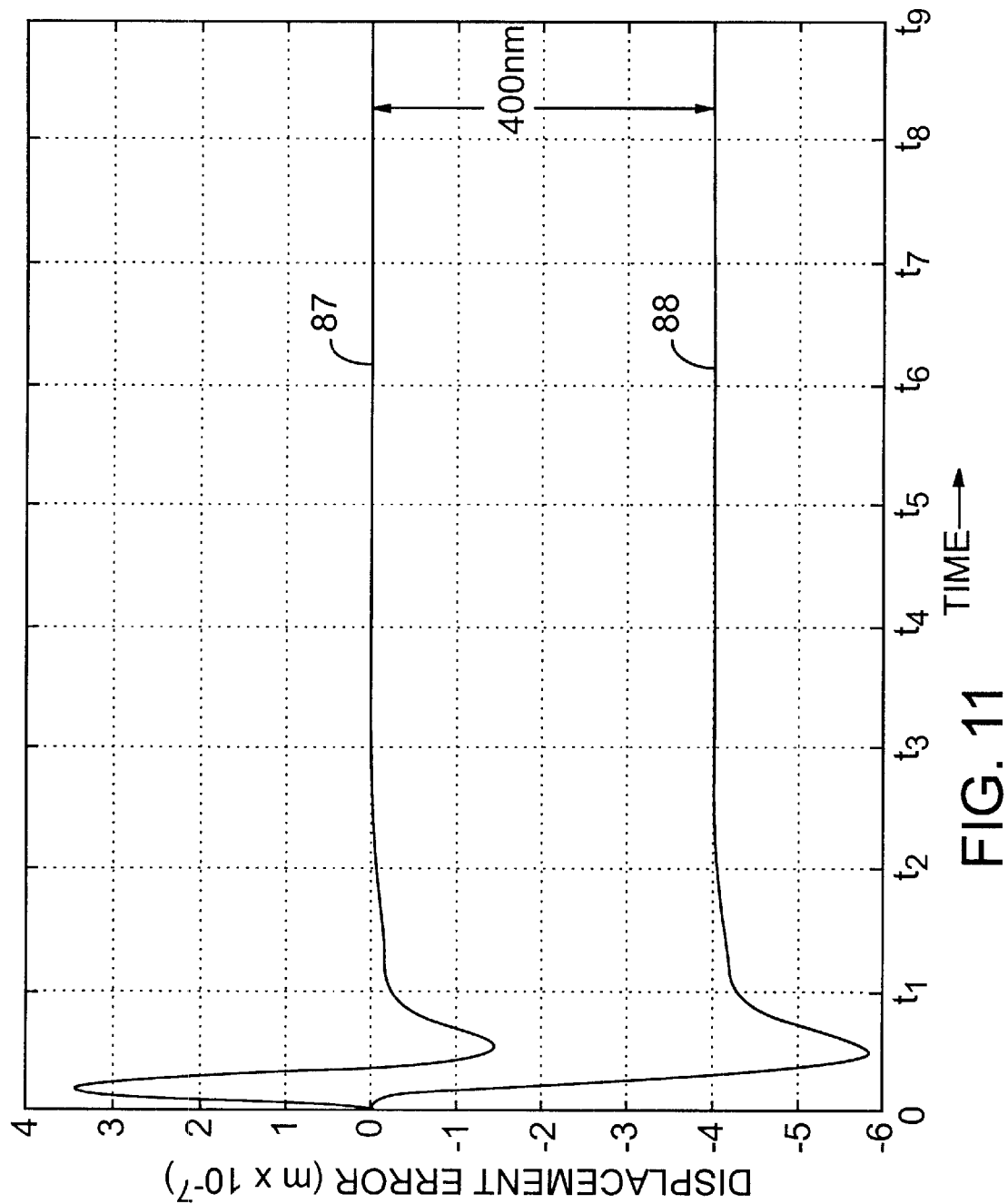
FIG. 11 is a plot of results obtained using the control system of Comparison Example 3, wherein the upper plot is of wafer-table displacement error accompanying a wafer-table tilt ($\theta$), and the lower plot is of wafer-stage displacement error.

A control block diagram of the comparison example is shown in FIG. 10, in which components that are similar to corresponding components shown in FIG. 2 have the same respective reference numerals. A control system as shown in FIG. 10 was used to produce the plots shown in FIG. 11. In this conventional scheme, if the wafer table undergoes a change in tilt, the wafer stage makes a compensatory lateral shift as required. In the comparison example, the distance between the wafer surface and the center of rotation 54 is 40 mm. As the wafer table experiences a 10 μrad tilt, the wafer stage experiences a lateral compensatory movement of 400 nm. Two curves are shown in FIG. 11. The upper curve 87 is of "output a" (wafer table lateral shift) in FIG. 10, and the lower curve 88 is of "output b" (wafer-stage position) in FIG. 10. Note the 400-nm difference between the two curves.

Figure 12:
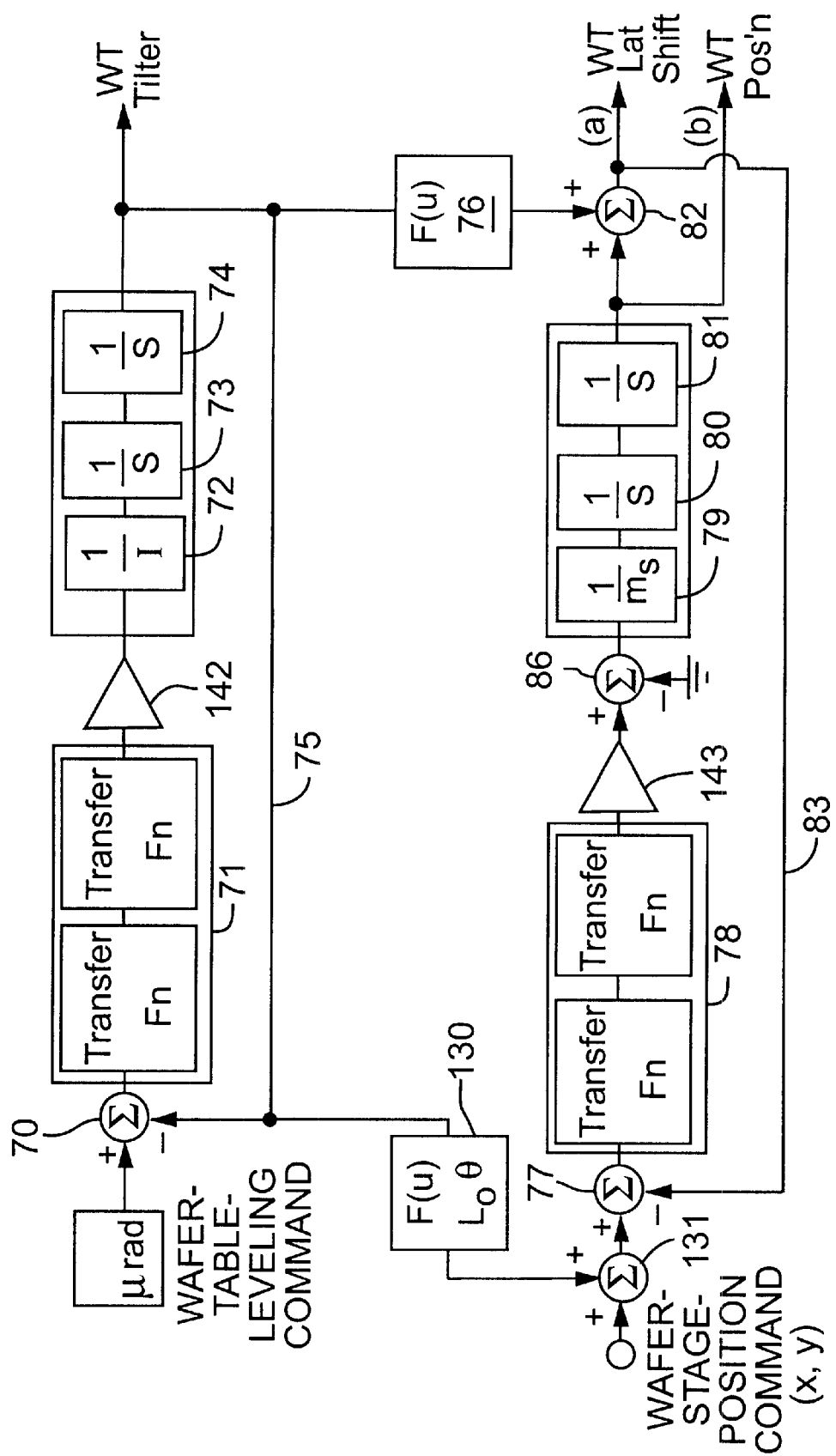
FIG. 12 is a block diagram of the control system of Example 3.
Figure 13:
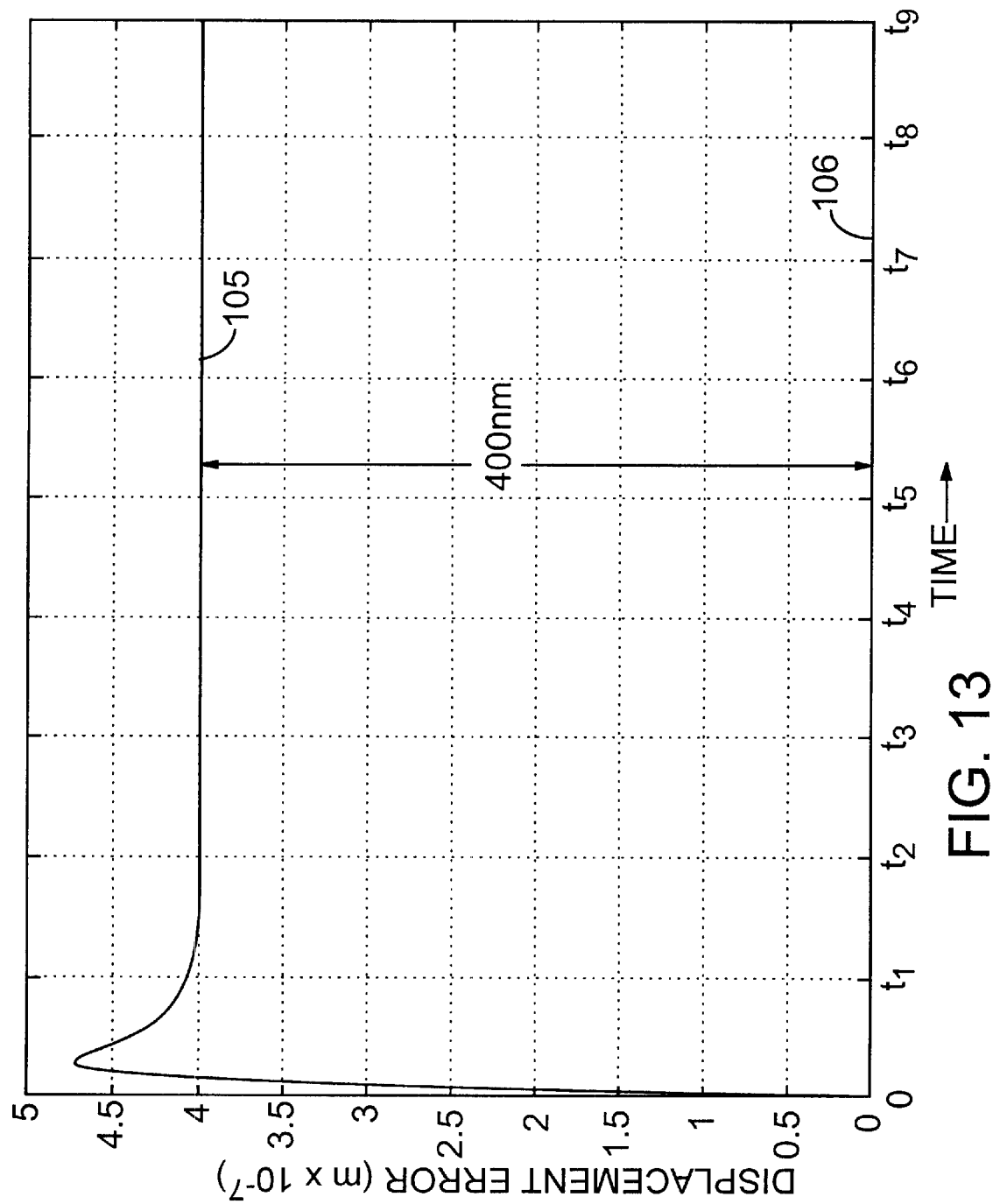
FIG. 13 is a plot of results obtained using the control system of Example 3.

A block diagram of a control scheme according to Example 3 is shown in FIG. 12. In this control scheme, the wafer-control system receives data regarding the lateral shift of a tilting wafer table. But, the wafer stage maintains a target position even if the wafer-stage interferometer 36 detects a lateral-shift error. To such end, the control scheme shown in FIG. 12 includes a "wafer-stage target control" loop in which data regarding wafer-table lateral shift is fed-forward from the feedback loop 75 via a controller 130 (corresponding to the conversion matrix 117 shown in FIG. 7) to an adder (summing junction) 131 situated upstream of the comparator 77. The controller 130 converts the data regarding wafer-table lateral shift to corresponding positional data useful as a target position for the wafer stage. The adder 131 also receives data regarding the target wafer-stage position, and the output from the adder 131 is input to the comparator 77. The resulting curve 105 is shown in FIG. 13, showing that output (b) (curve 106; wafer-stage position) has been reduced to zero. Meanwhile, output (a) (curve 105; wafer-table lateral shift) exhibits the expected 400-nm lateral shift.

Figure 14:
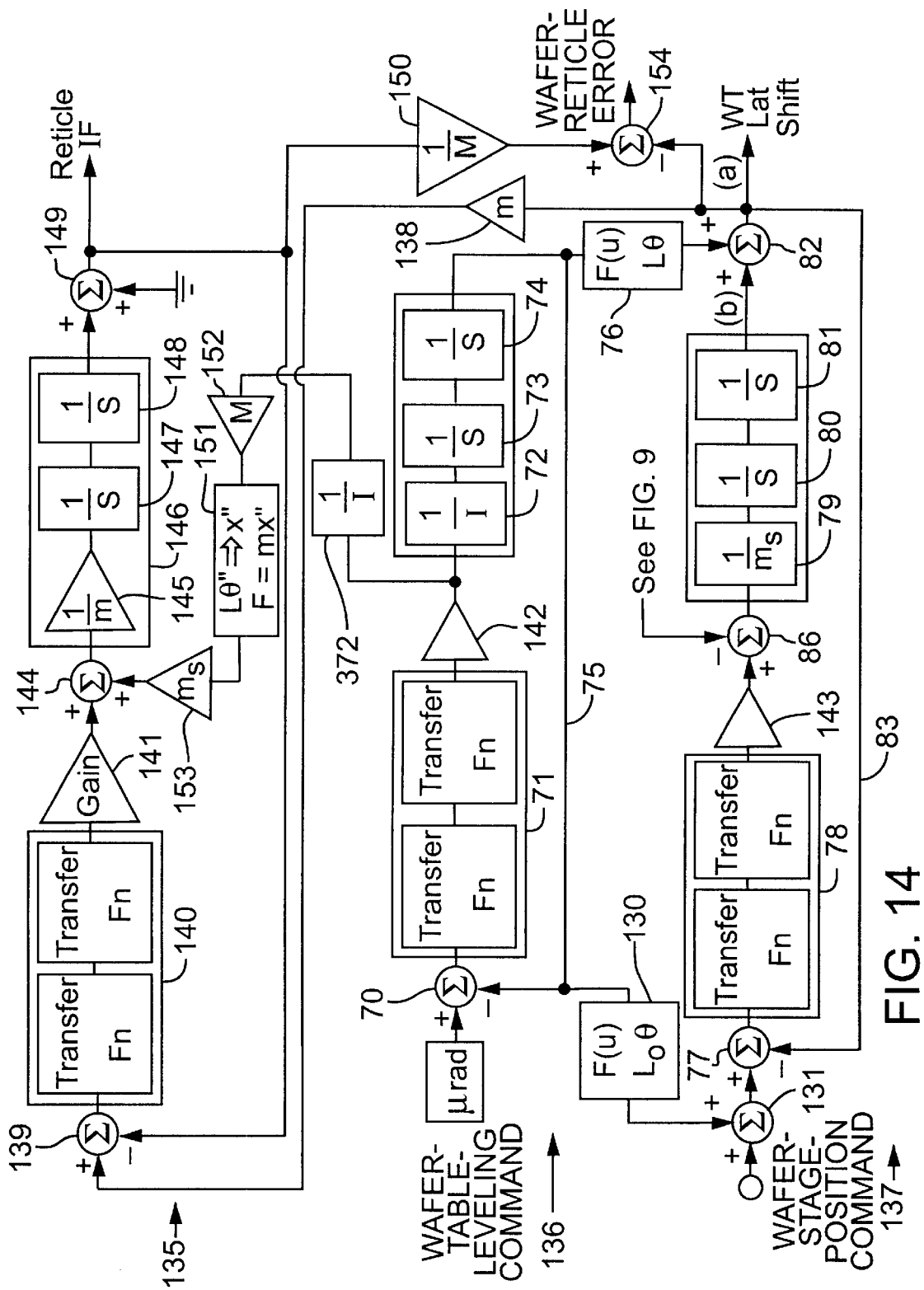
FIG. 14 is a block diagram of the control system of Example 4.

To cause the reticle stage to make a lateral motion to compensate for tilting of the wafer table, reference is made to the block diagram of FIG. 14, showing a control system 135 for the reticle stage. (Respective control systems 136, 137 for the wafer table and wafer stage are also shown, which are similar to the block diagram shown in FIG. 12). The control system 135 is connected to the control system 137 via a converter 138 (that applies a factor M to its input, wherein 1/M is the demagnfication ratio of the projection-optical system). Data from the converter 138 are routed to a comparator 139. The output of the comparator 139 is connected to a controller 140 that is analogous (in terms of processing incoming data using at least one transfer function) to the controllers 78, 71. Data from the controller 140 are passed through a gain amplifier 141 (analogous to amplifier models 142, 143 in the control systems 136, 137, respectively) to an adder (summing junction) 144. The output of the adder 144 is routed to a reticle-stage physical system 146 and an adder (summing junction) 149. The reticle-stage physical system 146 includes a converter 145 (that applies a factor 1/m to its input, wherein m=resting mass of the reticle stage) and integrators 147, 148. The output (reticle interferometer) from the adder 149 is fed-forward through a converter 150 (that applies the factor 1/M to its input) to a comparator 154 that also receives, as input, data output from the adder 82. The output of the adder 149 also is fed-back to the comparator 139. The adder 144 also receives a "reticle-stage feed-forward" input converted from wafer-table X, Y lateral direction with θ acceleration. The reticle-stage feed-forward includes a first converter 372 (that produces a θ" signal, similarly to the converter 272 shown in FIG. 3), a second converter 152 (that applies the factor M to its input), a controller 151 (Lθ" to X"), and a third converter 153 (that applies the factor m to its input).

Figure 15A:
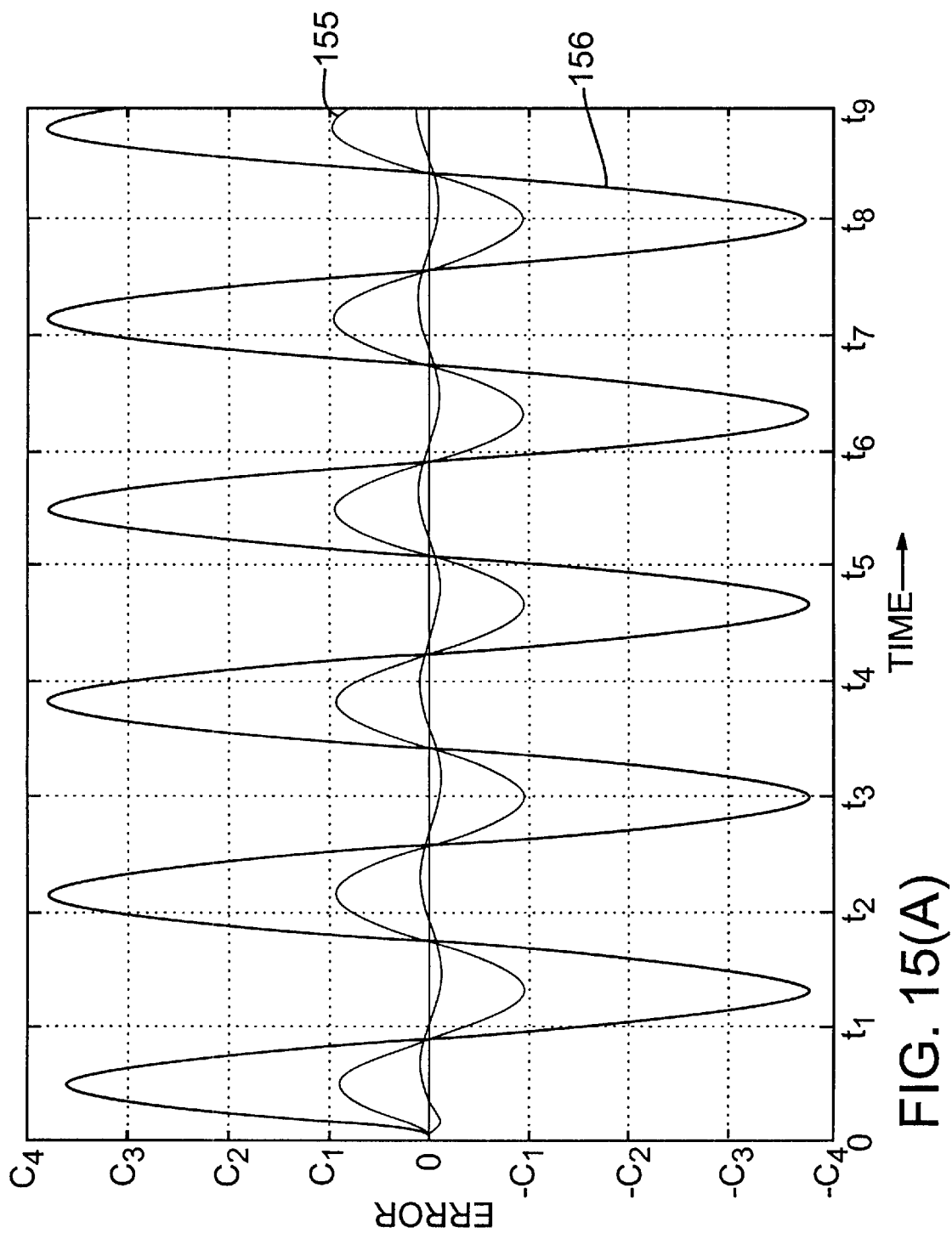
FIG. 15(A) is a plot of results obtained using the control system of Example 4, but without reticle-stage feed-forward.
Figure 15B:
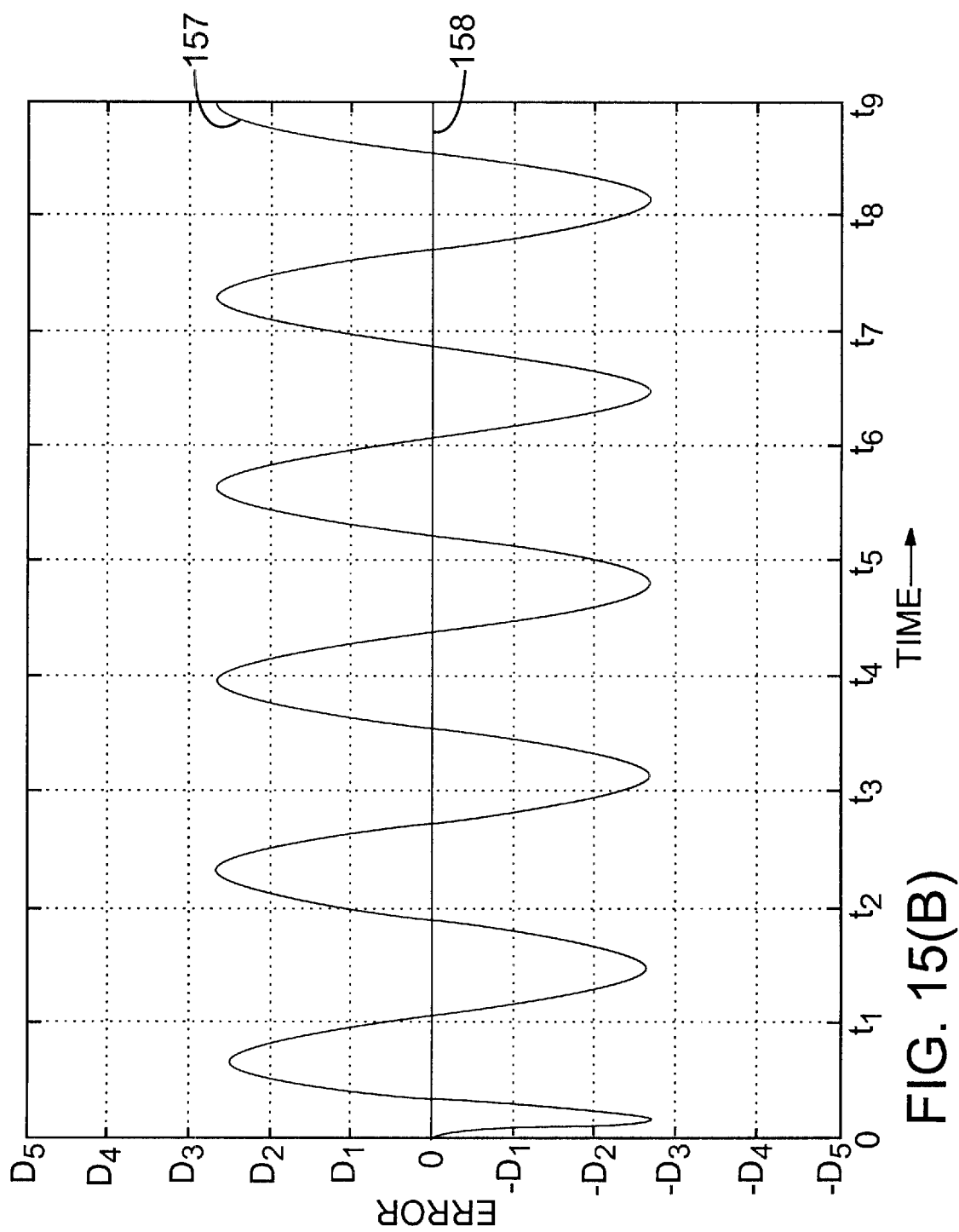
FIG. 15(B) is a plot of results obtained using the control system of Example 4, but with reticle-stage feed-forward.

Results obtained using the control system of FIG. 14 are shown in FIGS. 15(A) and 15(B). The curves shown in FIG. 15(A) are of data obtained without reticle-stage feed-forward (FIG. 10), and the curves shown in FIG. 15(B) are of data obtained with the reticle-stage feed-forward (FIG. 14). Turning first to FIG. 15(A), curve 155 is the output of the wafer stage interferometer, and curve 156 represents the response of the reticle stage. In FIG. 15(B), the curve 157 was obtained with the reticle-stage feed-forward off, and the curve 158 was obtained with the reticle-stage feed-forward on. The leveling shift error is attenuated (curve 158) with feed-forward.

Fourth Representative Embodiment

Figure 18:
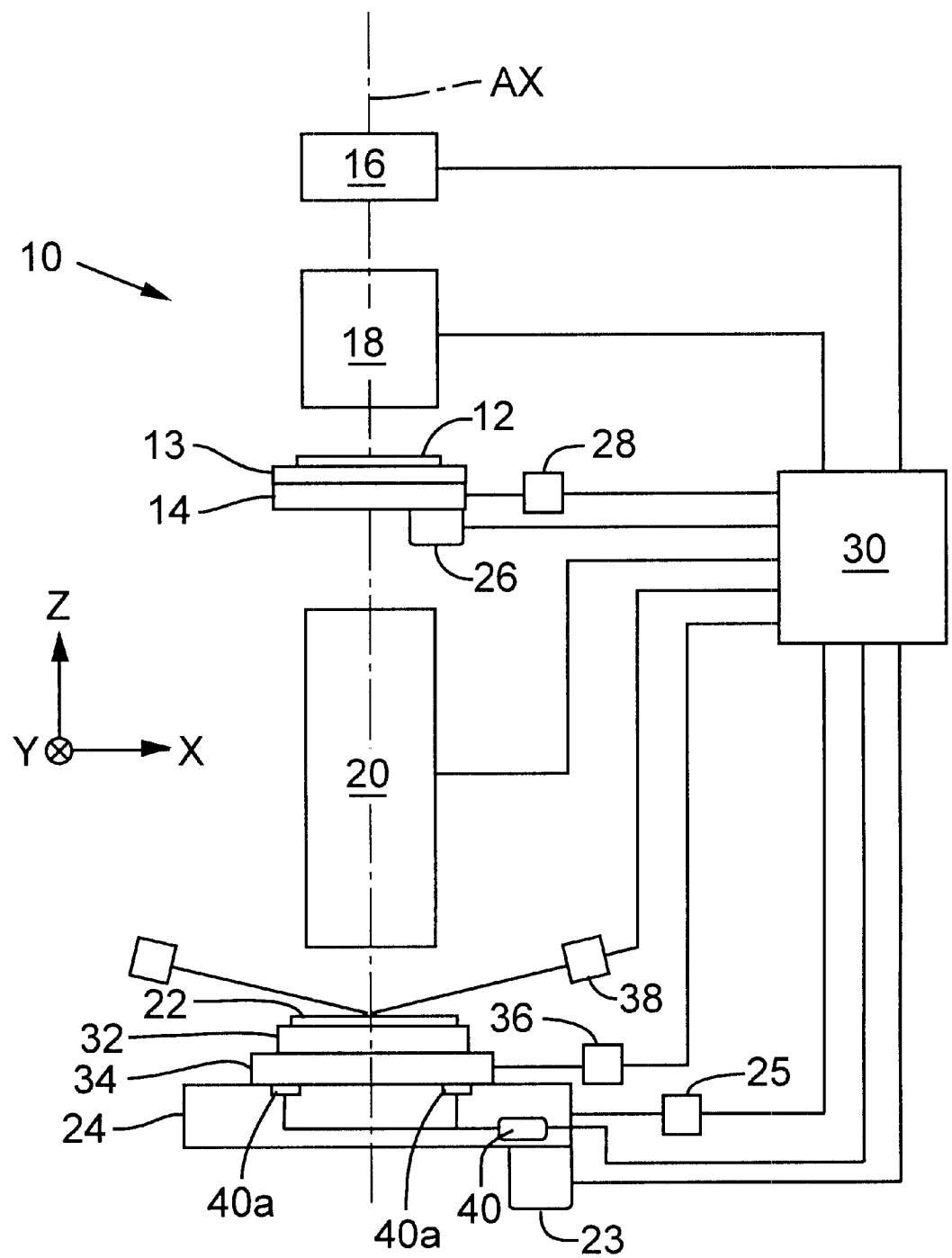
FIG. 18 is an elevational schematic diagram showing certain aspects of a conventional exposure apparatus.

This embodiment is directed generally to a positioning apparatus for positioning a substrate. The apparatus includes a "first stage" movable at least in a first direction. This first stage can be the wafer stage 24 shown in FIG. 18. The apparatus also includes a "second stage" (e.g., the wafer table 34; FIG. 18) mounted on the first stage 24. The second stage is configured to retain a substrate and is tiltable relative to the first stage 24.

Figure 3:
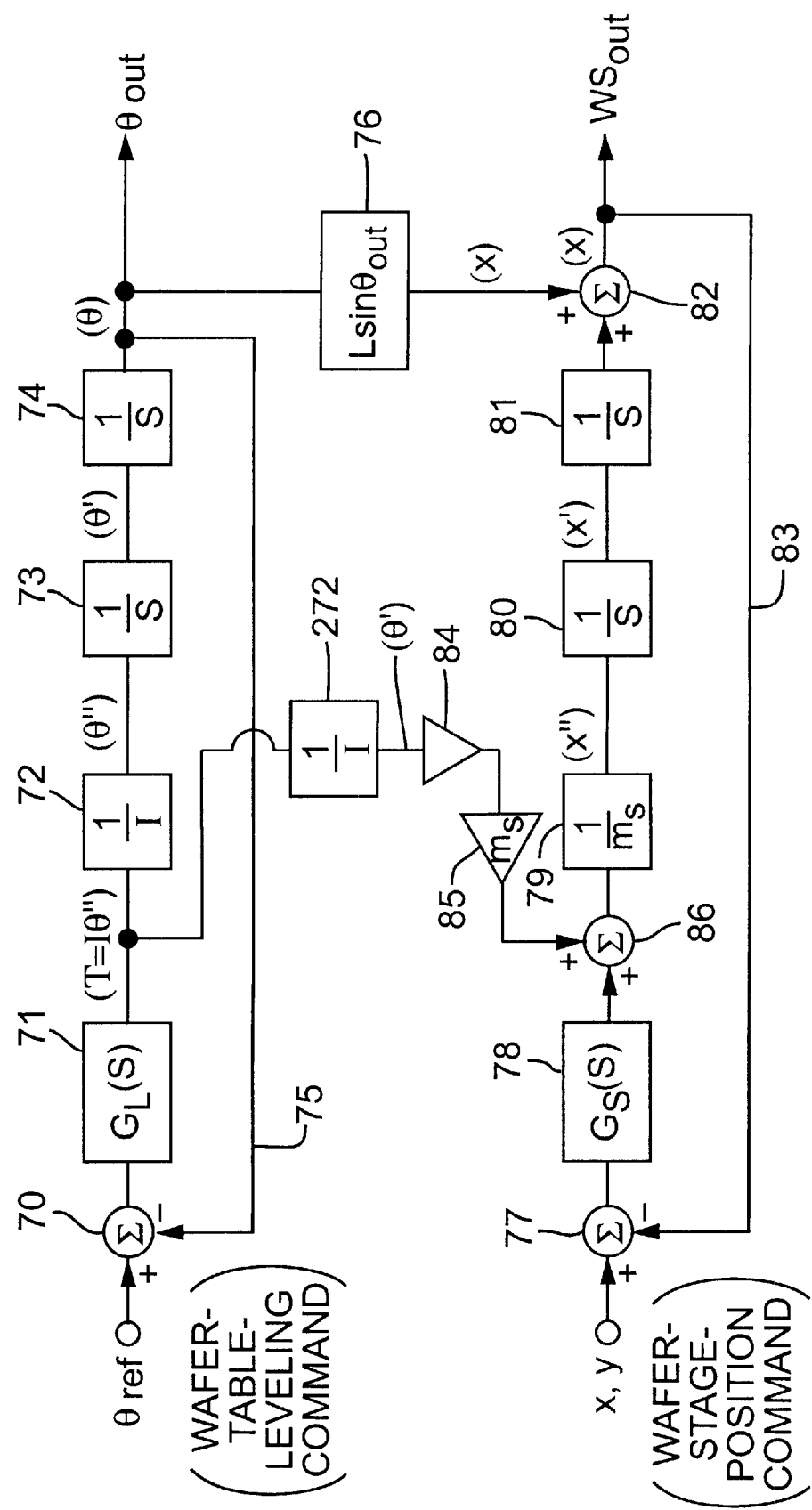
FIG. 3 is a block diagram of the control system described in the second representative embodiment, which provides a changing axis of rotation of the wafer table.

The apparatus also includes a "control system" (e.g., the controller 30; FIG. 18) connected to the first stage 24 and the second stage 34. The control system 30 has a first-stage-position loop for the first stage 24 and a second-stage-position loop for the second stage 34. An exemplary "first-stage-position loop" includes a combination of the comparator 50, the wafer-stage controller 51, the converter amplifier 52, and feed-back loop 53 (FIGS. 1 and 7). Another exemplary first-stage-position loop includes a combination of the comparator 77, controller 78, converter 79, first integrator 80, second integrator 81, gain amplifier 143, and feed-back 83 (FIGS. 3, 5, 8, 12, and 14). An exemplary "second-stage-position loop" includes a combination of the comparator 45, controller 46, converter 47, and feed-back loop 48 (FIGS. 1 and 7). Another exemplary second-stage-position loop includes a combination of the comparator 70, controller 71, converter 72, first and second integrators 73, 74, respectively, feed-back line 75, first transfer matrix 90, comparator 91, second transfer matrix 92, third transfer matrix 94, differential block 97, velocity servo Jacobian matrix 98, feed-back line 99, gain amplifier 142, and feed-back line 75 (FIGS. 3, 5, 8, 12, and 14). An exemplary "feed-forward loop" includes a combination of the coordinate converter 60, controller 62, and adder 64 (FIG. 1). Another exemplary feed-forward loop includes a combination of the converters 272 and 84, controller 85, adder 86, fifth transfer matrix 102, sixth transfer matrix 103, seventh transfer matrix 104, and on/off switch 192 (FIGS. 3, 5, and 8). The feed-forward loop is connected to the first-stage-position loop and the second-stage-position loop.

The first-stage-position loop actuates movement of the first stage by utilizing a first-stage control signal, and the second-stage-position loop actuates a tilting motion of the second stage by utilizing a second-stage control signal. The feed-forward loop converts the second-stage control signal to the first-stage control signal, the first-stage control signal causes the first stage to move in a manner that compensates for the lateral shift of the substrate accompanying a change in tilt of the second stage.

Fifth Representative Embodiment

This embodiment is directed generally to a positioning apparatus for positioning a substrate. The apparatus includes a "first stage" movable at least in a first direction. This first stage can be the wafer stage 24 shown in FIG. 18 and includes a first-stage-position loop. The apparatus also includes a "second stage" (e.g., the wafer table 34; FIG. 18) mounted on the first stage 24. The second stage includes a second-stage-position loop. A "feed-forward loop" interconnects the first-stage-position loop and the second-stage-position loop. The second stage is configured to retain a substrate and is tiltable relative to the first stage 24. The apparatus also includes a "third stage" that is movable at least in the first direction and configured to move synchronously with the substrate moved by the first stage. The third stage can be the reticle fine stage 13 or the reticle stage 14 (FIG. 18).

The apparatus also includes a "control system" (e.g., the controller 30 in FIG. 18) connected to the first, second, and third stages. The control system includes a second-stage-position loop for the second stage, a third-stage-position loop for the third stage, and a first feed-forward loop connected to the second-stage-position loop and the third-stage-position loop. An exemplary "second-stage-position loop" includes a combination of the comparator 45, controller 46, converter 47, and feed-back loop 48 (FIGS. 1 and 7). Another exemplary second-stage-position loop includes a combination of the comparator 70, controller 71, converter 72, first and second integrators 73, 74, respectively, feed-back line 75, first transfer matrix 90, comparator 91, second transfer matrix 92, third transfer matrix 94, differential block 97, velocity servo Jacobian matrix 98, feed-back line 99, gain amplifier 142, and feed-back line 75 (FIGS. 3, 5, 8, 12, and 14). An exemplary "third-stage-position loop" includes a combination of the adder 121, comparator 122, controller 123, converters 124, 125, and comparator 127 (FIG. 7). Another exemplary third-stage-position loop includes a combination of the comparator 161, controller 162, converter 165, adder 166, transfer functions 167, 168, on/off switch 190, reticle physical system 170, adder 173, converter 160, converter 174, and comparator 175 (FIG. 12). Yet another exemplary third-stage-position loop includes a combination of the comparator 139, controller 140, gain amplifier 141, reticle physical system 146, adder 149, converter 138, converter 150, and comparator 154 (FIG. 14). An exemplary "first feed-forward loop" includes a combination of the controller 129 and adder 128 (FIG. 7). Another exemplary first feed-forward loop is a combination of the converter 372, first converter 152, controller 151, second converter 153, and adder 144 (FIG. 14).

The second-stage-position loop actuates a tilting motion of the second stage by utilizing a second-stage control signal. The "second-stage control signal" includes at least one of the wafer-table leveling command, torque signal T, θ" (FIGS. 1 and 3); angular acceleration of the wafer table 34, desired torque coordinates $\theta_{xp}$, $\theta_{yp}$, and desired $Z_p$ force (FIG. 5); sensor data, θ, torque data (FIG. 7); wafer-table X, Y lateral direction with θ acceleration (FIG. 14).

The third-stage-position loop actuates movement of the third stage by utilizing a third-stage control signal. The "third-stage control signal" includes at least one of the reticle-stage-position command, force (V) signals, x", y", force data (FIG. 7); and reticle-stage feed-forward input (FIG. 14).

The first feed-forward loop converts the second-stage control signal to the third-stage control signal. The third-stage control signal causes the third stage to move in a manner that compensates for alignment errors between the third stage and the substrate accompanying a change in tilt of the second stage.

The control system can further include a first-stage-position loop for the first stage and a second feed-forward loop connected to the second-stage-position loop and the first-stage-position loop. An exemplary "first-stage-position loop" includes a combination of the comparator 50, the wafer-stage controller 51, the converter amplifier 52, and feed-back loop 53 (FIGS. 1 and 7). Another exemplary first-stage-position loop includes a combination of the comparator 77, controller 78, converter 79, first integrator 80, second integrator 81, gain amplifier 143, and feed-back 83 (FIGS. 3, 5, 8, 12, and 14). An exemplary "second feed-forward loop" includes a combination of the conversion matrix 117, adder 116, and x and y position (FIG. 7). Another exemplary second feed-forward loop includes a combination of the controller 130 and adder 131 (FIGS. 12 and 14). The first-stage-position loop actuates movement of the first stage by utilizing a first-stage control signal. An exemplary "first-stage control signal" includes at least one of the wafer-stage-position command, force signal F, and x" (FIG. 1); and acceleration of the wafer stage 24, X", and Y" (FIG. 5). The second feed-forward loop converts the second-stage control signal to the first-stage control signal. The first-stage control signal causes the first stage to move in a manner that compensates, at least in part, for alignment errors between the third stage and the substrate accompanying a change in tilt of the second stage. Remaining compensation is contributed by the third stage as controlled by the first feed-forward loop.

Sixth Representative Embodiment

A microlithography apparatus (generally termed an "exposure apparatus") with which any of the foregoing embodiments can be used is depicted in FIG. 18, which is discussed above.

The exposure apparatus 10 can be any of various types. For example, as an alternative to operating in a "step-and-repeat" manner characteristic of steppers, the exposure apparatus can be a scanning-type apparatus operable to expose the pattern from the reticle 12 to the wafer 22 while continuously scanning both the reticle 12 and wafer 22 in a synchronous manner. During such scanning, the reticle 12 and wafer 22 are moved synchronously in opposite directions perpendicular to the optical axis Ax. The scanning motions are performed by the respective stages 14, 24.

In contrast, a step-and-repeat exposure apparatus performs exposure only while the reticle 12 and wafer 22 are stationary. If the exposure apparatus is an "optical lithography" apparatus, the wafer 22 typically is in a constant position relative to the reticle 12 and projection-optical system 20 during exposure of a given pattern field. After the particular pattern field is exposed, the wafer 22 is moved, perpendicularly to the optical axis Ax and relative to the reticle 12, to place the next field of the wafer 22 into position for exposure. In such a manner, images of the reticle pattern are sequentially exposed onto respective fields on the wafer 22.

Exposure apparatus as provided herein are not limited to microlithography apparatus for manufacturing microelectronic devices. As a first alternative, for example, the exposure apparatus can be a microlithography apparatus used for transferring a pattern for a liquid-crystal display (LCD) onto a glass plate. As a second alternative, the exposure apparatus can be a microlithography apparatus used for manufacturing thin-film magnetic heads. As a third alternative, the exposure apparatus can be a proximity-microlithography apparatus used for exposing, for example, a mask pattern. In this alternative, the mask and substrate are placed in close proximity with each other, and exposure is performed without having to use a projection-optical system 20.

The principles set forth in the foregoing disclosure further alternatively can be used with any of various other apparatus, including (but not limited to) other microelectronic-processing apparatus, machine tools, metal-cutting equipment, and inspection apparatus.

In any of various exposure apparatus as described above, the source 16 (in the illumination-optical system 18) of illumination "light" can be, for example, a g-line source (436 nm), an i-line source (365 nm), a KrF excimer laser (248 nm), an ArF excimer laser (193 nm), or an $F_2$ excimer laser (157 nm). Alternatively, the source 16 can be of a charged particle beam such as an electron or ion beam, or a source of X-rays (including "extreme ultraviolet" radiation). If the source 16 produces an electron beam, then the source can be a thermionic-emission type (e.g., lanthanum hexaboride ($LaB_6$) or tantalum (Ta)) of electron gun. If the illumination "light" is an electron beam, then the pattern can be transferred to the wafer 22 from the reticle 12 or directly to the wafer 22 without using a reticle.

With respect to the projection-optical system 20, if the illumination light comprises far-ultraviolet radiation, then the constituent lenses are made of UV-transmissive materials such as quartz and fluorite that readily transmit ultraviolet radiation. If the illumination light is produced by an $F_2$ excimer laser or EUV source, then the lenses of the projection-optical system 20 can be either refractive or catadioptric, and the reticle 12 desirably is a reflective type. If the illumination "light" is an electron beam (as a representative charged particle beam), then the projection-optical system 20 typically comprises various charged-particle-beam optics such as electron lenses and deflectors, and the optical path should be in a suitable vacuum. If the illumination light is in the vacuum ultraviolet (VUV) range (less than 200 nm), then the projection-optical system 20 can have a catadioptric configuration with beam splitter and concave mirror, as disclosed for example in U.S. Pat. Nos. 5,668,672 and 5,835,275, incorporated herein by reference. The projection-optical system 20 also can have a reflecting-refracting configuration including a concave mirror but not a beam splitter, as disclosed in U.S. Pat. Nos. 5,689,377 and 5,892,117, incorporated herein by reference.

Either or both the reticle stage 14 and wafer stage 24 can include respective linear motors for achieving the motions of the reticle 12 and wafer 22, respectively, in the X-axis and Y-axis directions. The linear motors can be air-levitation types (employing air bearings) or magnetic-levitation types (employing bearings based on the Lorentz force or a reactance force). Either or both stages 14, 24 can be configured to move along a respective guide or alternatively can be guideless. See U.S. Pat. Nos. 5,623,853 and 5,528,118, incorporated herein by reference.

Further alternatively, either or both stages 14, 24 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 14, 24 as described herein can generate reaction forces that can affect the performance of the exposure apparatus. Reaction forces generated by motion of the wafer stage 24 can be shunted to the floor (ground) using a frame member as described, e.g., in U.S. Pat. No. 5,528,118, incorporated herein by reference. Reaction forces generated by motion of the reticle stage 14 can be shunted to the floor (ground) using a frame member as described in U.S. Pat. No. 5,874,820, incorporated herein by reference.

An exposure apparatus such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical system components and assemblies are adjusted as required to achieve maximal optical accuracy. Similarly, mechanical and electrical systems are adjusted as required to achieve maximal respective accuracies. Assembling the various subsystems into an exposure apparatus requires the making of mechanical interfaces, electrical-circuit wiring connections, and pneumatic plumbing connections as required between the various subsystems. Typically, constituent subsystems are assembled prior to assembling the subsystems into an exposure apparatus. After assembly of the apparatus, system adjustments are made as required for achieving overall system specifications in accuracy, etc. Assembly at the subsystem and system levels desirably is performed in a clean room where temperature and humidity are controlled.

Seventh Representative Embodiment

Figure 16:
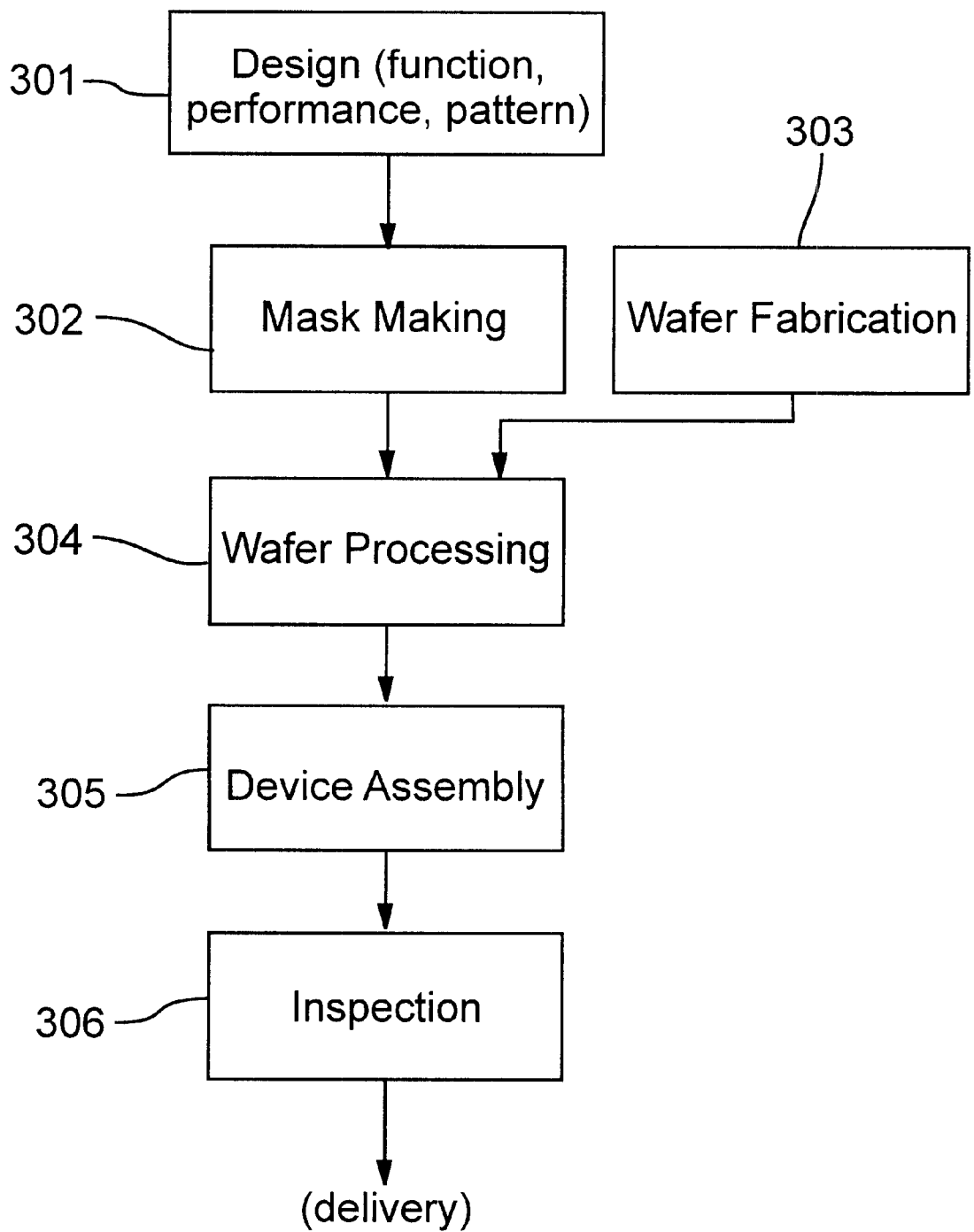
FIG. 16 is a flow chart of certain steps in an exemplary process for manufacturing a microelectronic device, as described in the seventh representative embodiment.

Any of various microelectronic devices and displays can be fabricated using an apparatus as described above in the sixth representative embodiment. An exemplary process is depicted in FIG. 16. In step 301, the function and performance characteristics of the subject device are designed. Next, in step 302, a mask (reticle) defining a corresponding pattern is designed according to the specifications established in the preceding step. In a parallel step 303 to step 302, a wafer or other suitable substrate is made. In step 304 the mask pattern designed in step 302 is exposed onto the wafer using an exposure apparatus as described herein. In step 305 the microelectronic device is assembled; this typically includes dicing, bonding, and packaging steps as well known in the art. Finally, in step 306, the devices are inspected.

Figure 17:
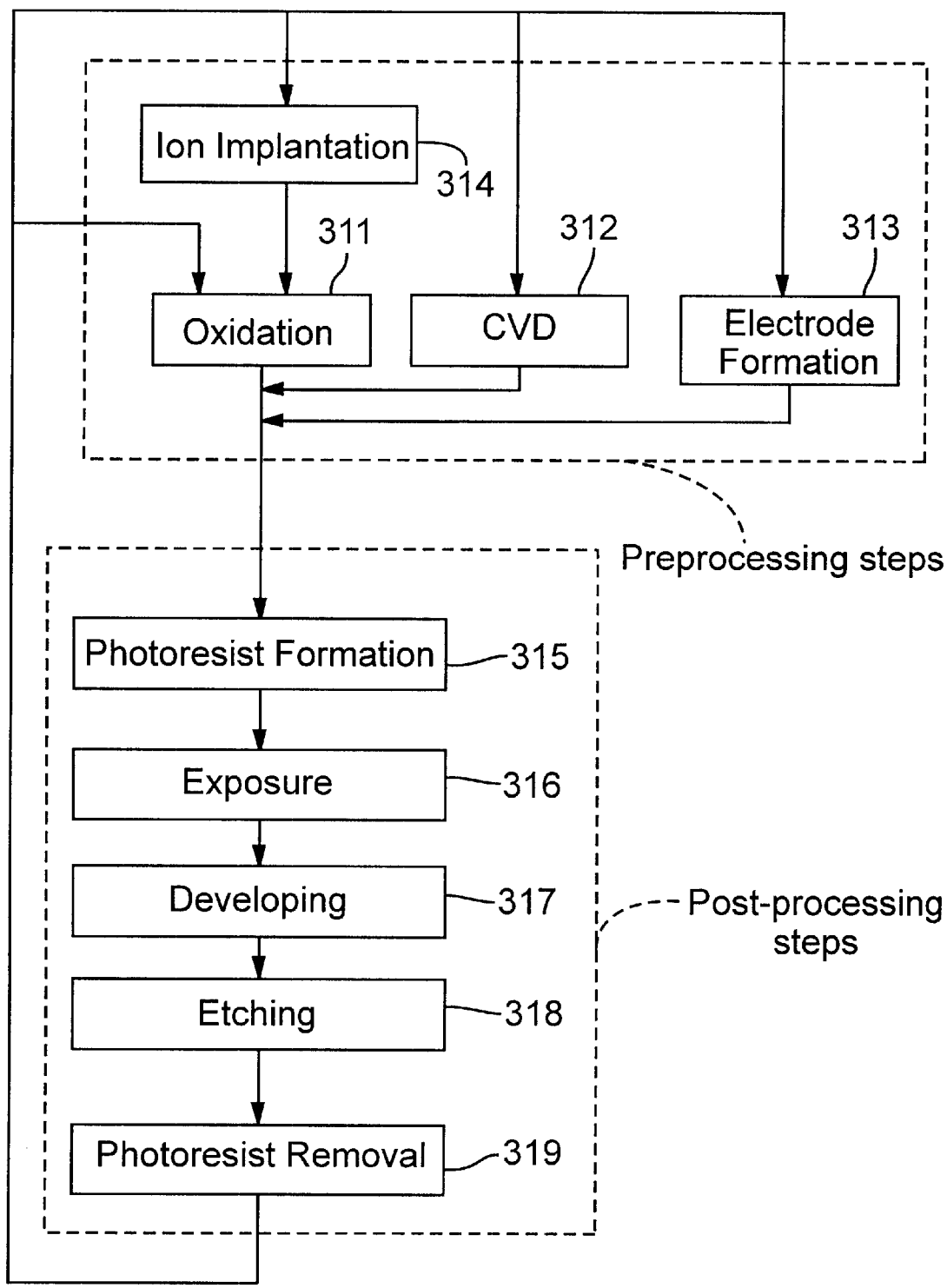
FIG. 17 is a flow chart of certain details of the microlithographic exposure step in the process of FIG. 16.

FIG. 17 is a flow chart of details of step 304, as applied to manufacturing microelectronic devices. In step 311 (oxidation) the surface of the wafer is oxidized. In step 312 ("CVD" or chemical vapor deposition) an insulating film is formed on the wafer surface. In step 313 (electrode formation) electrodes are formed on the wafer by vapor deposition. In step 314 (ion implantation) ions are implanted in the wafer. These steps 311–314 constitute the "pre-process" steps for wafers during wafer processing; during these steps selections are made as required according to processing requirements.

Continuing further with FIG. 17, at each stage of wafer processing, after the above-mentioned pre-process steps are completed, the following "post-process" steps are executed. Initially, in step 315 (photoresist formation), a layer of a suitable resist is applied to the wafer surface. Next, in step 316 (exposure), the microlithography apparatus is used to transfer the circuit pattern defined by the mask (reticle) to the wafer. In step 317 (developing) the exposed layer of resist on the wafer surface is developed. In step 318 (etching), portions of the wafer surface not protected by residual resist are removed by etching. In step 319 (photoresist removal) any resist remaining after completing the etching step is removed.

Multiple circuit patterns are formed on the wafer surface by repeating these pre-process and post-process steps as required.

Whereas the invention has been described in connection with multiple representative embodiments and examples, it will be understood that the invention is not limited to those embodiments and examples. On the contrary, the invention is intended to encompass all modifications, alternatives, and equivalents as may be included within the spirit and scope of the invention, as defined by the appended claims.

What is claimed is:

1. In an exposure apparatus including a wafer stage movable at least in X- and Y-directions and a leveling table tiltable relative to a Z-axis that is perpendicular to the X- and Y-directions, a control system hat compensates for lateral shift of the leveling table caused by a tilt (θ) of the leveling table, the control system comprising:
    a wafer-stage-position loop servo configured to actuate movement of the wafer stage in response to a positional command;
    a leveling-table tilt-position loop servo configured to apply a tilting torque to the leveling table in response to a leveling command; and
    a feed-forward loop from the leveling-table tilt-position loop servo to the wafer-stage-position loop servo, the feed-forward loop being (a) configured to convert a torque-control signal for the leveling table to a linear-acceleration-control signal for the wafer stage, the linear-acceleration-control signal causing the wafer stage to move laterally in a manner that compensates for the lateral shift of the leveling table accompanying a change in tilt of the leveling table; and (b) represented y a block diagram comprising:
        a coordinate converter connected to the leveling-table tilt-position loop servo and configured to convert an angular-acceleration (θ") command from the leveling-table tilt-position loop servo to a corresponding linear-acceleration command output from the coordinate converter,
        a controller connected downstream of the coordinate converter and configured to apply a factor $m_s$ to the linear-acceleration command output from the coordinate converter, wherein $m_s$ is a combined mass of the wafer stage and leveling table, thereby producing a first force command; and
        an adder situated and configured to add the first force command to a second force command produced by the wafer-stage-position loop servo, so as to produce an output routed to a wafer-stage actuator.

2. The control system of claim 1, wherein the exposure apparatus further includes a reticle stage movable at least in the X- and Y-directions, and a reticle-stage-position loop servo configured to actuate movement of the reticle stage in response to a reticle-position command, the control system further comprising a second feed-forward loop from the leveling-table tilt-position loop servo to the reticle-stage-position loop servo, the second feed-forward loop being configured to convert a positional signal for the leveling table to a position-control signal for the reticle stage, the position-control signal causing the reticle stage to move laterally to compensate, at least in part, for the lateral shift of the leveling table accompanying a change in tilt of the leveling table.

3. In an exposure apparatus including a wafer stage movable at least in X- and Y-directions, a leveling table tiltable relative to a Z-axis that is perpendicular to the X- and Y-directions, and a reticle stage movable at least in the X- and Y-directions, a control system for compensating for lateral shift of the leveling table caused by a tilt (θ) of the leveling table, the control system comprising:
    a reticle-stage-position loop servo configured to actuate movement of the reticle stage in response to a reticle-position command;
    a leveling-table tilt-position loop servo configured to apply a tilting torque to the leveling table in response to a leveling command; and
    a first feed-forward loop from the leveling-table tilt-position loop servo to the reticle-stage-position loop servo, the first feed-forward loop being configured to convert a torque-control signal for the leveling table to a linear-acceleration-control signal for the reticle stage, the linear-acceleration-control signal causing the reticle stage to move laterally to compensate for the lateral shift of the leveling table accompanying a change in tilt of the leveling table.

4. The control system of claim 3, wherein the first feed-forward loop is represented by a block diagram comprising:
    a controller connected to the leveling-table tilt-position loop servo and configured to convert a torque command from the leveling-table tilt-position loop servo to a corresponding linear-acceleration or force command output from the controller; and
    an adder situated and configured to add the command output from the controller to a force command produced by the reticle-stage-position loop servo, so as to produce an output routed to a reticle-stage actuator.

5. The control system of claim 4, further comprising:
    a wafer-stage-position loop servo configured to actuate movement of the wafer stage in response to a wafer-position command; and
    a second feed-forward loop from the leveling-table tilt-position loop servo to the wafer-stage-position loop servo, the second feed-forward loop being configured to convert a torque-control signal for the leveling table to a linear-acceleration-control signal for the wafer stage, the linear-acceleration-control signal causing the wafer stage to move laterally in a manner that compensates, at least in part, for the lateral shift of the leveling table accompanying a change in tilt of the leveling table, with remaining compensation being contributed by the reticle stage as controlled by the first feed-forward loop.

6. The control system of claim 5, further comprising a leveling-table tilt sensor located within a feedback loop of the leveling-table tilt-position loop servo, wherein the second feed-forward loop is represented by a block diagram comprising a second controller and a second adder, the second controller being situated and configured to receive a θ output signal from the leveling-table tilt sensor and to convert the θ output signal to a corresponding positional signal routed to the second adder, the second adder being configured to add the θ output signal to a wafer-stage-position command routed to the wafer-stage-position loop servo.

7. The control system of claim 3, further comprising a wafer-stage-position loop servo, a second feed-forward loop, and a leveling-table-tilt sensor located within a feedback loop of the leveling-table tilt-position loop servo, wherein the second feed-forward loop is represented by a block diagram comprising a controller and an adder, the controller being situated and configured to receive a θ output signal from the leveling-table tilt sensor and to convert the θ output signal to a corresponding positional signal routed to the adder, the adder being configured to add the θ output signal to a wafer-stage-position command routed to the wafer-stage-position loop servo.

8. An exposure apparatus, comprising:
   a projection-optical system having an optical axis parallel to a Z-axis;
   a wafer stage situated downstream of the projection-optical system and being movable at least in the X- and Y-axis directions;
   a leveling table situated do stream of the projection-optical system and being tiltable relative to the Z-axis;
   a wafer-stage-position loop servo connected to the wafer stage and configured to actuate movement of the wafer stage in response to a wafer-position command;
   a leveling-table tilt-position loop servo connected to the leveling table and configured to apply a tilting torque to the leveling table in response to a leveling command; and
   a control system for compensating for lateral shift of the leveling table caused by a tilt (θ) of the leveling table, the control system comprising a feed-forward loop from the leveling-table tilt-position loop servo to the wafer-stage-position loop servo, the feed-forward loop being (a) configured to convert a torque-control signal for the leveling table to a linear-acceleration-control signal for the wafer-stage, the linear-acceleration-control signal causing the wafer stage to move laterally in a manner that compensates for the lateral shift of the leveling table accompanying a change in tilt of the leveling table; and (b) represented by a block diagram comprising:
      a coordinate converter connected to the leveling-table tilt-position loop servo and configured to convert an angular-acceleration (θ") command from the leveling-table tilt-position loop servo to a corresponding linear-acceleration command output from the coordinate converter;
      a controller connected downstream of the coordinate converter and configured to apply a factor $m_s$ to the linear-acceleration command output of the coordinate converter, wherein $m_s$ is a combined mass of the wafer stage and leveling table, thereby producing a first force command; and
      an adder situated and configured to add the first force command to a second force command produced by the wafer-stage-position loop servo, so as to produce an output routed to a wafer-stage actuator.

9. The exposure apparatus of claim 8, further comprising:
   a reticle stage situated upstream of the projection-optical system and being movable at least in the X- and Y-directions; and
   a reticle-stage-position loop servo connected to the reticle stage and being configured to actuate movement of the reticle stage in response to a reticle-position command, wherein the control system further comprises a second feed-forward loop from the leveling-table tilt-position loop servo to the reticle-stage-position loop servo, the second feed-forward loop being configured to convert a positional signal for the leveling table to a position-control signal for the reticle stage, the position-control signal causing the reticle stage to move laterally to compensate, at least in part, for the lateral shift of the leveling table accompanying a change in tilt of the leveling table.

10. An exposure apparatus, comprising:
    a projection-optical system having an optical axis parallel to a Z-axis;
    a leveling table situated downstream of the projection-optical system and being tiltable relative to the Z-axis;
    a reticle stage situated upstream of the projection-optical system and being movable at least in X- and Y-directions;
    a leveling-table tilt-position loop servo connected to the leveling table and being configured to apply a tilting torque to the leveling table in response to a leveling command;
    a reticle-stage-position loop servo connected to the reticle stage and being configured to actuate movement of the reticle stage in response to a reticle-position command; and
    a control system for compensating for lateral shift of the leveling table caused by a tilt (θ) of the leveling table, the control system comprising a first feed-forward loop from the leveling-table tilt-position loop servo to the reticle-stage-position loop servo, the first feed-forward loop being configured to convert a torque-control signal for the leveling table to a linear-acceleration-control signal for the reticle stage, the linear-acceleration-control signal causing the reticle stage to move laterally to compensate for the lateral shift of the leveling table accompanying a change in tilt of the leveling table.

11. The exposure apparatus of claim 10, further comprising a reticle-stage actuator that is (i) situated and configured to move the reticle stage in response to the reticle-position command, and (ii) connected to the first feed-forward loop and configured to move the reticle stage in response to linear-acceleration-control signal.

12. The exposure apparatus of claim 10, wherein the first feed-forward loop is represented by a block diagram comprising:
    a controller connected to the leveling-table tilt-position loop servo and configured to convert a torque command from the leveling-table tilt-position loop servo to a corresponding linear-acceleration command or force command output from the controller; and
    an adder situated and configured to add the command output from the controller to a force command produced by the reticle-stage-position loop servo, so as to produce an output routed to a reticle-stage actuator.

13. The exposure apparatus of claim 10, further comprising:
    a wafer stage situated downstream of the projection-optical system and configured to be movable at least in the X- and Y-axis directions; and
    a wafer-stage-position loop servo connected to the wafer stage and configured to actuate movement of the wafer stage in response to a wafer-position command.

14. The exposure apparatus of claim 13, wherein the control system further comprises a second feed-forward loop from the leveling-table tilt-position loop servo to the wafer-stage-position loop servo, the second feed-forward loop being configured to convert a torque-control signal to the leveling table to a linear-acceleration-control signal for the wafer stage, the linear-acceleration-control signal causing the wafer stage to move laterally in a manner that compensates, at least in part, for the lateral shift of the leveling table accompanying a change in tilt of the leveling table, with remaining compensation being contributed by the reticle stage as controlled by the first feed-forward loop.

15. The exposure apparatus of claim 14, further comprising a leveling-table tilt sensor located within a feedback loop of the leveling-table tilt-position loop servo, wherein the second feed-forward loop is represented by a block diagram comprising a second controller and a second adder, the second controller being situated and configured to receive a θ output signal from the leveling-table tilt sensor and to convert the θ output signal to a corresponding positional signal routed to the second adder, and the second adder being configured to add the θ output signal to a wafer-stage-position command routed to the wafer-stage-position loop servo.

16. In an exposure method in which a substrate, mounted on a wafer stage movable at least in mutually perpendicular X- and Y-axis directions, is exposed to a pattern defined by a reticle, a method for maintaining an alignment of the substrate for exposure, the method comprising:

mounting the substrate on leveling table that is tiltable relative to a Z-axis perpendicular to the X- and Y-axis directions, the leveling table being mounted on the wafer stage and being controlled by a leveling-table tilt-position loop servo that applies a tilting torque to the leveling table as required in response to a leveling command corresponding to a torque-control signal, and the wafer stage being controlled by a wafer-stage-position loop servo that actuates movement of the wafer stage at least in the X- and Y-axis directions as required in response to a wafer-position command;

in association with tilting of the leveling table in response to the tilting command, feeding forward the torque-control signal from the leveling-table tilt-position loop servo to the wafer-stage-position loop servo such that the torque-control signal is converted to an acceleration-control signal for the wafer stage, the acceleration-control signal causing the wafer stage to move laterally to compensate for a lateral shift of the leveling table caused by tilting of the leveling table;

mounting the reticle in a reticle stage movable at least in the X- and Y-axis directions and controlled by a reticle-stage-position loop servo that actuates movement of the reticle stage in response to a reticle-position command; and in association with tilting of the leveling table in response to the tilting command, (i) feeding forward the torque-control signal from the leveling-table tilt-position loop servo to the reticle-stage-position loop servo, (ii) converting the fed-forward torque-control signal to a linear-acceleration-control signal for the reticle stage, and (iii) applying the linear-acceleration-control signal to the reticle stage to cause the reticle stage to move laterally to compensate for a lateral shift of the leveling table accompanying a change in tilt of the leveling table.

17. In an exposure method in which a substrate, mounted on a wafer stage movable at least in mutually perpendicular X- and Y-axis directions, is exposed to a pattern defined by a reticle mounted on a reticle stage, a method for maintaining an alignment of the substrate for exposure, the method comprising:

mounting the substrate on a leveling table that is tiltable relative to a Z-axis that is perpendicular to the X- and Y-axis directions, the leveling table being mounted on the wafer stage and being controlled by a leveling-table tilt-position loop servo that applies a tilting torque to the leveling table as required in response to a leveling command corresponding to a torque-control signal;

mounting the reticle in a reticle stage movable at least in the X- and Y-axis directions and controlled by a reticle-stage-position loop servo that actuates movement of the reticle stage in response to a reticle-position command; and in association with tilting of the leveling table in response to the tilting command, (i) feeding forward the torque-control signal from the leveling-table tilt-position loop servo toward the reticle-stage-position loop servo, (ii) converting the fed-forward torque-control signal to an acceleration-control signal for the reticle stage, and (iii) applying the acceleration-control signal to the reticle stage to cause the reticle stage to move laterally to compensate for a lateral shift of the leveling table accompanying a change in tilt of the leveling table.

18. The method of claim 17, including the step, while causing the reticle stage to move laterally to compensate for the lateral shift of the leveling table, of inhibiting compensating motions of the wafer stage.

19. A method for operating an exposure apparatus, comprising the method for maintaining alignment as recited in claim 16.

20. A method for making an object, the method comprising a microlithography process that includes the method for operating an exposure apparatus as recited in claim 19.

21. A method for processing a wafer, comprising the method of operating an exposure apparatus as recited in claim 19.

22. A method for operating an exposure apparatus, comprising the method for maintaining alignment as recited in claim 17.

23. A method for making an object, the method comprising a lithography process that includes the method for operating an exposure apparatus as recited in claim 22.

24. A method for processing a wafer, comprising the method of operating an exposure apparatus as recited in claim 22.

25. A positioning apparatus for positioning a substrate, comprising:

a first stage movable at least in a first direction;

a second stage mounted on the first stage, the second stage being configured to retain a substrate and being tiltable relative to the first stage; and a control system connected to the first stage and the second stage, the control system comprising a first-stage-position loop for the first stage, a second-stage-position loop for the second stage, and a feed-forward loop connected to the first-stage-position loop and the second-stage-position loop;

wherein the first-stage-position loop actuates movement of the first stage by utilizing a first-stage control signal;

the second-stage-position loop actuates a tilting motion of the second stage by utilizing a second-stage control signal;

the feed-forward loop converts the second-stage control signal to the first-stage control signal; and the first-stage control signal causes the first stage to move in a manner that compensates for the lateral shift of the substrate accompanying a change in tilt of the second stage.

26. A positioning apparatus that positions a substrate, comprising:

a first stage that is movable at least in a first direction;

a second stage mounted on the first stage, the second stage being configured to retain the substrate and be tiltable relative to the first stage;

a third stage that is movable at least in the first direction, the third stage being configured to move synchronously with the substrate moved by the first stage; and a control system connected to the first, second, and third stages, the control system comprising a second-stage-position loop for the second stage, a third-stage-position loop for the third stage, and a first feed-forward loop connected to the second-stage-position loop and the third-stage-position loop;

wherein the second-stage-position loop actuates a tilting motion of the second stage by utilizing a second-stage control signal;

the third-stage-position loop actuates movement of the third stage by utilizing a third-stage control signal;

the first feed-forward loop converts the second-stage control signal to the third-stage control signal; and the third-stage control signal causes the third stage to move in a manner that compensates for alignment errors between the third stage and the substrate accompanying a change in tilt of the second stage.

27. The positioning apparatus of claim 26, wherein:

the control system further comprises a first-stage-position loop for the first stage and a second feed-forward loop connected to the second-stage-position loop and the first-stage-position loop;

the first-stage-position loop actuates movement of the first stage by utilizing a first-stage control signal; and the second feed-forward loop converts the second-stage control signal to the first-stage control signal, the first-stage control signal causing the first stage to move in a manner that compensates, at least in part, for alignment errors between the third stage and the substrate accompanying a change in tilt of the second stage, with remaining compensation being contributed by the third stage as controlled by the first feed-forward loop.

28. An exposure apparatus, comprising:

an illumination system that irradiates radiant energy; and the positioning apparatus of claim 26, the positioning apparatus disposing the substrate within a trajectory of the radiant energy.

29. In an exposure apparatus including a reticle stage movable at least in X- and Y-directions, a wafer stage movable at least in X- and Y-directions, a leveling table associated with the wafer stage and tiltable relative to a Z-axis that is perpendicular to the X- and Y-directions, and a control system that compensates for lateral shift of the leveling table caused by a tilt ($\theta$) of the leveling table, the control system comprising:

a wafer-stage-position loop servo configured to actuate movement of the wafer stage in response to a positional command;

a leveling-table tilt-position loop servo configured to apply a tilting torque to the leveling table in response to a leveling command;

a feed-forward loop from he leveling-table tilt-position loop servo to the wafer-stage-position loop servo, the feed-forward loop being configured to convert a torque-control signal for the leveling table to a linear-acceleration-control signal for the wafer stage, the linear-acceleration-control signal causing the wafer stage to move laterally in a manner that compensates for the lateral shift of the leveling table accompanying a change in tilt of the leveling table; and a reticle-stage-position loop servo configured to actuate movement of the reticle stage in response to a reticle-position command, the control system further comprising a second feed-forward loop from the leveling-table tilt-position loop servo to the reticle-stage-position loop servo, the second feed-forward loop being configured to convert a positional signal for the leveling table to a position-control signal for the reticle stage, the position-control signal causing the reticle stage to move laterally to compensate, at least in part, for the lateral shift of the leveling table accompanying a change in tilt of the leveling table.

30. An exposure apparatus, comprising:

a projection-optical system having an optical axis parallel to a Z-axis;

a wafer stage situated do stream of the projection-optical system and being movable at least in the X- and Y-axis directions;

a leveling table situated downstream of the projection-optical system and being tiltable relative to the Z-axis;

a wafer-stage-position loop servo connected to the wafer stage and configured to actuate movement of the wafer stage in response to a wafer-position command;

a leveling-table tilt-position loop servo connected to the leveling table and configured to apply a tilting torque to the leveling table in response to a leveling command;

a control system for compensating for lateral shift of the leveling table caused by a tilt ($\theta$) of the leveling table, the control system comprising a feed-forward loop from the leveling-table tilt-position loop servo to the wafer-stage-position loop servo, the feed-forward loop being configured to convert a torque-control signal for the leveling table to a linear-acceleration-control signal for the wafer-stage, the linear-acceleration-control signal causing the wafer stage to move laterally in a manner that compensates for the lateral shift of the leveling table accompanying a change in tilt of the leveling table;

a reticle stage situated upstream of the projection-optical system and being movable at least in the X- and Y-directions;

a reticle-stage-position loop servo connected to the reticle stage and being configured to actuate movement of the reticle stage in response to a reticle-position command, wherein the control system further comprises second feed-forward loop from the leveling-table tilt-position loop servo to the reticle-stage-position loop servo, the second feed-forward loop being configured to convert a positional signal for the leveling table to a position-control signal for the reticle stage, the position-control signal causing the reticle stage to move laterally to compensate, at least in part, for the lateral shift of the leveling table accompanying a change in tilt of the leveling table.

* * * * *

UNITED STATES PATENT AND TRADEMARK OFFICE
CERTIFICATE OF CORRECTION

PATENT NO. : 6,618,120 B2
DATED : September 9, 2003
INVENTOR(S) : Ueta

It is certified that error appears in the above-identified patent and that said Letters Patent is hereby corrected as shown below:

Column 1,
Line 62, "$\theta_3$-directions" should read -- $\theta_z$-directions --.

Column 12,
Line 25, "74 $_{yp}$," should read -- $\theta_{yp}$, --.
Line 33, "$L\theta_y$" should read -- $L\theta_y"$ --.

Column 14,
Lines 6-7, "via a converter 125 applies" should read -- via a converter 125 that applies --.

Column 15,
Line 51, "FIG. 12)." should read -- FIG. 12.) --.

Column 21,
Line 19, "hat" should read -- that --.
Lines 36-37, "represented y" should read -- represented by --.
Line 43, "converter," should read -- converter; --.

Column 22,
Line 3, "X-and" should read -- X- and --.

Column 23,
Line 32, "wafer-stage" should read -- wafer stage --.

Column 27,
Line 63, "from he" should read -- from the --.

UNITED STATES PATENT AND TRADEMARK OFFICE
CERTIFICATE OF CORRECTION

PATENT NO. : 6,618,120 B2
DATED : September 9, 2003
INVENTOR(S) : Ueta

It is certified that error appears in the above-identified patent and that said Letters Patent is hereby corrected as shown below:

Column 28,
Line 23, "do stream" should read -- downstream --.

Signed and Sealed this

Twenty-fifth Day of October, 2005

JON W. DUDAS
*Director of the United States Patent and Trademark Office*